United States Patent
VerNooy et al.

(10) Patent No.: US 12,349,499 B2
(45) Date of Patent: Jul. 1, 2025

(54) CONDUCTIVE PASTE COMPOSITION, PREPARATION METHOD AND USE THEREOF, CRYSTALLINE SILICON SOLAR CELL

(71) Applicant: Jiangsu Solamet Electronic Materials Co., Ltd., Jiangsu (CN)

(72) Inventors: Paul Douglas VerNooy, Hockessin, DE (US); Qijie Guo, Hainesport, NJ (US)

(73) Assignees: Solamet Electronic Materials (Dongguan) Co., Ltd., Guangdong (CN); Solamet Materials Science Co., Ltd., Jiangsu (CN)

( * ) Notice: Subject to any disclaimer, the term of this patent is extended or adjusted under 35 U.S.C. 154(b) by 0 days.

(21) Appl. No.: 17/996,349

(22) PCT Filed: Mar. 10, 2022

(86) PCT No.: PCT/CN2022/080059
§ 371 (c)(1),
(2) Date: Oct. 16, 2022

(87) PCT Pub. No.: WO2023/115716
PCT Pub. Date: Jun. 29, 2023

(65) Prior Publication Data
US 2024/0234602 A1    Jul. 11, 2024

(30) Foreign Application Priority Data
Dec. 20, 2021   (CN) .......................... 202111558682.4

(51) Int. Cl.
H10F 77/164        (2025.01)
C03C 4/14           (2006.01)
(Continued)

(52) U.S. Cl.
CPC .......... H10F 77/1642 (2025.01); C03C 4/14 (2013.01); C03C 8/10 (2013.01); C03C 8/18 (2013.01); H10F 10/14 (2025.01); H10F 77/211 (2025.01)

(58) Field of Classification Search
CPC ....... H01L 31/03682; H01L 31/022425; H01L 31/068; C03C 4/14; C03C 8/10;
(Continued)

(56) References Cited

U.S. PATENT DOCUMENTS 5,376,596 A * 12/1994 Tokuda ..................... C03C 8/04
                                                                    501/19
2017/0144920 A1    5/2017  Yeh
(Continued)

FOREIGN PATENT DOCUMENTS

CN       2013-179038 A     9/2013
CN         103430243 A    12/2013
(Continued)

OTHER PUBLICATIONS

International Search Report in International application No. PCT/CN2022/080059, mailed on Aug. 26, 2022.
(Continued)

Primary Examiner — Michael Y Sun
(74) Attorney, Agent, or Firm — PV IP PC; Wei Te Chung

(57) ABSTRACT

A conductive paste composition, a preparation method and a use thereof, as well as a crystalline silicon solar cell are disclosed. The conductive paste composition contains a silver powder and an aluminum powder, and contains a lead-boron-selenium glass frit or a bismuth-boron-selenium glass frit. The conductive paste composition can perform effective etching of a passivation film of an n-type crystalline silicon solar cell during a high temperature firing, and
(Continued)

also does not over-oxidize the aluminum powder contained therein, thereby forming an electrode having decent electrical contact with a p-type doped emitter.

17 Claims, 2 Drawing Sheets

(51) Int. Cl.
    *C03C 8/10*       (2006.01)
    *C03C 8/18*       (2006.01)
    *H10F 10/14*     (2025.01)
    *H10F 77/20*     (2025.01)

(58) Field of Classification Search
    CPC ......... C03C 8/18; C03C 3/066; C03C 3/0745; C03C 8/04; H10F 77/1642; H10F 10/14; H10F 77/211; H10F 10/165; H10F 77/311; H10F 71/00; H01B 1/22; H01B 13/00; Y02E 10/547; Y02E 10/50; Y02P 70/50

See application file for complete search history.

(56) References Cited

U.S. PATENT DOCUMENTS

| | | | |
|---|---|---|---|
| 2018/0346371 | A1 | 12/2018 | Moyer |
| 2018/0351014 | A1* | 12/2018 | Cela Greven ... H01L 31/022425 |
| 2020/0013910 | A1 | 1/2020 | Carroll |

FOREIGN PATENT DOCUMENTS

| | | | |
|---|---|---|---|
| CN | 201426764 | A | 7/2014 |
| CN | 104795127 | A | 7/2015 |
| CN | 104835552 | A | 8/2015 |
| CN | 105051830 | A | 11/2015 |
| CN | 107089798 | A | 8/2017 |
| CN | 107438885 | A | 12/2017 |
| CN | 107746184 | A | 3/2018 |
| CN | 110021450 | A | 7/2019 |
| CN | 110143760 | A | 8/2019 |
| CN | 110337423 | A | 10/2019 |
| CN | 111592228 | A | 8/2020 |
| CN | 113045207 | A | 6/2021 |
| CN | 113178495 | A | 7/2021 |
| CN | 113409986 | A * | 9/2021 |
| CN | 113488223 | A | 10/2021 |
| CN | 113698103 | A | 11/2021 |
| JP | 2007-281023 | A | 10/2007 |
| JP | 2013-531863 | A | 8/2013 |
| JP | 2013179038 | A | 9/2013 |
| JP | 2014032946 | A | 2/2014 |
| JP | 2015170601 | A | 9/2015 |
| KR | 1020130016344 | A | 2/2013 |
| TW | 201426764 | A | 7/2014 |
| TW | 201428770 | A | 7/2014 |
| TW | 201537587 | A | 10/2015 |
| TW | 201626404 | A | 7/2016 |
| TW | 110407467 | A | 11/2019 |

OTHER PUBLICATIONS

Written Opinion of the International Search Authority in International application No. PCT/CN2022/080059, mailed on Aug. 26, 2022.
Chinese Office Action issued in corresponding Chinese Patent Application No. 202111558682.4 dated Aug. 17, 2022, pp. 1-13.
Taiwan Office Action issued in corresponding Taiwan Patent Application No. 111117934 dated Oct. 26, 2022, pp. 1-9.
Korean Office Action issued in corresponding Korean Patent Application No. 10-2022-7020999 dated Jan. 12, 2024, pp. 1-13.
Japanese Office Action issued in corresponding Japanese Patent Application No. 2022-552788 dated Feb. 6, 2024, pp. 1-4.
Taiwan Office Action issued in corresponding Taiwan Patent Application No. 112100657 dated Mar. 17, 2023, pp. 1-10.
Taiwanese Office Action issued in corresponding Taiwanese Patent Application No. 111117934 dated Jul. 8, 2024.
Taiwanese Office Action issued in corresponding Taiwanese Patent Application No. 112100657 dated Jul. 8, 2024.
Korean Notice of Allowance issued in corresponding Korean Patent Application No. 10-2022-7020999 dated Jun. 17, 2024.
Wang, Ge, Photovoltaic Cell Research (1), Jan. 29, 2019. Cited in Taiwanese Office Action issued in corresponding Taiwanese Patent Application No. 111117934 dated Jul. 8, 2024.
European Extended Search Report in International application No. 24190468.9, mailed on Sep. 20, 2024.
Taiwanese Office Action issued in corresponding Taiwanese Patent Application No. 111117934 dated Nov. 29, 2024.
Taiwanese Office Action issued in corresponding Taiwanese Patent Application No. 112100657 dated Dec. 17, 2024.
Japanese Notice of Allowance issued in corresponding Korean Patent Application No. 2022-552788 dated Nov. 12, 2024.

* cited by examiner

CONDUCTIVE PASTE COMPOSITION, PREPARATION METHOD AND USE THEREOF, CRYSTALLINE SILICON SOLAR CELL

CROSS REFERENCE TO RELATED APPLICATIONS

This present application is a U.S. national phase application based upon an International Application No. PCT/CN2022/080059, filed on Mar. 10, 2022, which claims the priority of China Patent Application, with application Ser. No. 20/211,1558682.4, titled as "CONDUCTIVE PASTE COMPOSITION, PREPARATION METHOD AND USE THEREOF, CRYSTALLINE SILICON SOLAR CELL", filed to the China Patent Office on Dec. 20, 2021, the disclosures of which are incorporated herein by reference in their entirety.

FIELD OF INVENTION

The present disclosure relates to the technical field of photovoltaic devices, and particularly relates to a conductive paste composition, a preparation method and a use thereof, and a crystalline silicon solar cell.

BACKGROUND OF INVENTION

Solar cells are used to convert a solar energy into a direct current electrical energy, and their basic structure is a pn junction formed by a p-type semiconductor and an n-type semiconductor. More specifically, one of the n-type crystalline silicon solar cells is based on an n-type doped silicon wafer (e.g., a phosphorus-doped silicon wafer), and a p-type doped semiconductor is formed on its surface by doping (e.g., by boron doping), to form a pn junction. The p-type doped semiconductor is also referred to as a p-type emitter. At least one passivation film, such as $Al_2O_3$ or $SiN_x$, is deposited on the surface of the p-type emitter. The passivation film has passivation and anti-reflection effects which maximizes the photovoltaic conversion efficiency of the solar cell. An electrode in the form of a conductive metal in electrical contact with the p-type emitter is then provided by metallization, so that the current generated by the photovoltaic conversion can be conducted to an external circuit load.

When preparing crystalline silicon solar cells, metallization of both the front and back sides of the cells is necessary. A screen printing process is usually adopted in the metallization of the front (light-facing side) of the cell to print a conductive metal paste on the surface of the passivation film in a desired pattern, and then the conductive metal paste etches and fires through the passivation film by firing at a high temperature to form electrical contact with the emitter, thereby forming a conductive structure (or electrode) in the form of a conductive metal contact. The quality of the electrical contact of the electrode includes the electrical contact resistance and the carrier recombination due to metallization, which directly affects the photovoltaic conversion efficiency of solar cells. The conductive metal paste typically used to form an electrode includes a conductive substance (e.g., a silver particle), a glass frit, and an organic medium serving as a vehicle for printing. The conductive metal paste used for contacting the p-type semiconductor also adds an aluminum powder to achieve a low-resistance ohmic contact.

In order for the conductive metal paste and the p-type semiconductor to form a decent balance in electrical contact resistance and carrier recombination, the etching of the passivation film needs to be controlled at a reasonable level when the conductive metal paste is fired at a high temperature. If the etching is insufficient, the passivation film cannot be fired through, so that the conductive metal paste cannot form an ohmic electrical contact with the p-type semiconductor. If the etching is excessive, the carrier recombination will be greatly increased due to over-etching, which will lead to a loss of open circuit voltage, thereby affecting the photovoltaic conversion efficiency.

The glass frit, as one of the most important components in the conductive metal paste, is primarily used to etch the passivation film. Therefore, the composition of the glass frit will also directly affect the conversion efficiency of metallization crystalline silicon solar cells.

Currently, the common glass frit in the conductive metal paste used to contact the p-type semiconductor is a lead-boron-silicon glass frit, which contains lead oxide, boron oxide, and silicon oxide. The lead-boron-silicon glass frit has a relatively high glass transition temperature (Tg point), which is inadequate for high temperature fast firing of crystalline silicon solar cells. In order to reduce the Tg point of the lead-boron-silicon glass frit, common methods include: reducing the content of boron which has a high melting point, increasing the content of a fluxing element (such as an alkali metal, an alkaline earth metal, or a rare earth metal), or adding thallium (Tl), etc. However, if the content of boron is too low, it becomes difficult for the glass frit to maintain an amorphous state and becomes easily crystallized. Moreover, if the content of an alkali metal, an alkaline earth metal, or a rare earth metal is too high, although the Tg point can be reduced, the efficiency of a photovoltaic device will be affected due to high corrosivity. In addition, although the addition of thallium can effectively reduce the Tg point, thallium is a highly toxic element which is harmful to the human body and pollutes the environment. Therefore, it is necessary to find a glass former that can effectively reduce the Tg of the glass frit used in the conductive paste containing an aluminum powder for contacting the p-type semiconductor. For example, for p-type solar cell technology, such as a passivated emitter and rear cell (p-PERC) or a passivated emitter and rear cell-selective emitter, (p-PERC-SE), it has been shown that tellurium is a very efficient glass former. However, tellurium oxide can oxidize the aluminum powder in the conductive metal paste used to contact the p-type semiconductor, which will affect the ohmic contact and reduce the efficiency of the photovoltaic device.

SUMMARY OF DISCLOSURE

In order to overcome the above mentioned drawbacks, some embodiments of the present disclosure provide a conductive paste composition, a preparation method and a use thereof, a crystalline silicon solar cell electrode, or a n-type crystalline silicon solar cell, which are capable of forming an electrical contact with a p-type doped semiconductor (hereinafter referred to as a p-type semiconductor) of an n-type crystalline silicon solar cell during the firing process.

The following technical solutions are adopted in some embodiments of the present disclosure:

[A First Conductive Paste and its Preparation Method and Use]

Some embodiments of the present disclosure provide a first conductive paste composition for forming an electrical contact with a p-type semiconductor of an n-type crystalline silicon solar cell.

Wherein, the first conductive paste composition comprising:

(1) a lead-boron-selenium glass frit accounting for 0.5% to 10% (percentage by weight) of a total solid in the above conductive paste composition;
(2) a conductive component accounting for 87% to 99% (percentage by weight) of the total solid in the conductive paste composition;
(3) an aluminum elemental component accounting for 0.5% to 3% (percentage by weight) of the total solid in the conductive paste composition;
(4) an organic medium.

Wherein, the lead-boron-selenium glass frit, the conductive component, and the aluminum elemental component are used as the total solid in the conductive paste composition, and the sum of the percentages by weight of the three is 100%. Since the organic medium will be burnout in a subsequent treatment process, the content of the organic medium is calculated separately and is not included in the above 100%. The lead-boron-selenium glass frit is lead-boron-selenium-oxide based solid that is used for at least etching the passivation film in the n-type crystalline silicon solar cell to form the electrical contact with the p-type semiconductor. The conductive component forms a silver-aluminum electrode for electrical contact with the p-type semiconductor after firing. The organic medium is used to disperse the above solid and provide a printing property.

In some embodiments, the conductive paste composition and the lead-boron-selenium glass frit of the present disclosure do not contain any form of tellurium (Te), such as $TeO_2$.

In some other embodiments, based on the total weight of the dry weight of the lead-boron-selenium glass frit, the lead-boron-selenium glass frit contains no more than 1.2 wt % of $TeO_2$.

In some embodiments, based on the total weight of the dry weight of the lead-boron-selenium glass frit, the lead-boron-selenium glass frit at least contains 50% to 85% of PbO, 2% to 34% of $B_2O_3$, and 0.1% to 16% of $SeO_2$. The percentage is a percentage by weight (wt %).

In some other embodiments, based on the total weight of the dry weight of the lead-boron-selenium glass frit, the lead-boron-selenium glass frit further contains 0.1% to 25% of additives. The additives are selected from any one or more of the group consisting of $PbF_2$, $SiO_2$, $Bi_2O_3$, $BiF_3$, $AgO_2$, $Ag_2O$, AgO, ZnO, MgO, CaO, $Al_2O_3$, $Li_2O$, $Na_2O$, $K_2O$, $Rb_2O$, $Ce_2O$, and $Fe_2O_3$. When the lead-boron-selenium glass frit contains no additives, it is necessary to ensure that a total content of the three components of PbO, $B_2O_3$ and $SeO_2$ in the dry weight of the lead-boron-selenium glass frit is 100%. When the lead-boron-selenium glass frit contains additives, it is necessary to ensure that the total content of PbO, $B_2O_3$, $SeO_2$ and additives is 100%. On the premise that the total content of each component of the lead-boron-selenium glass frit is 100%, the percentage content of each component can be adjusted with any value within the above range. The same applies to the adjustment of the content of each component in the bismuth-boron-selenium glass frit.

In some embodiments, based on the total weight of the dry weight (wt %) of the lead-boron-selenium glass frit, the content of PbO in the lead-boron-selenium glass frit ranges from 51.0% to 82.0%, 55% to 75%, 65.9% to 74.5%, 68.8% to 73.1%, or 70% to 71.7%. The adjustment of the content needs to be ensured that the sum of the percentages by weight of each component of the lead-boron-selenium glass frit is 100%.

In some embodiments, based on the total weight of the dry weight of the lead-boron-selenium glass frit, the content of $B_2O_3$ in the lead-boron-selenium glass frit ranges from 3% to 32%, 4% to 30%, 2% to 20%, 6.8% to 10%, 7.1% to 7.6%, or 7.4% to 7.5%. The adjustment of the content needs to be ensured that the sum of the percentages by weight of each component of the lead-boron-selenium glass frit is 100%.

In some embodiments, based on the total weight of the dry weight of the lead-boron-selenium glass frit, the content of $SeO_2$ in the lead-boron-selenium glass frit ranges from 0.2% to 15%, 0.5% to 13.1%, 1% to 10%, 1.9% to 9.4%, 2.1% to 8.1%, or 3.7% to 5.6%. The adjustment of the content needs to be ensured that the sum of the percentages by weight of each component of the lead-boron-selenium glass frit is 100%.

In some embodiments, based on the total weight of the dry weight of the lead-boron-selenium glass frit, the content of the additives in the lead-boron-selenium glass frit ranges from 0.5% to 20%, 5% to 19%, 8% to 17%, 10% to 16%, 14.2% to 15.7%, or 14.7% to 15.3%.

In some embodiments, lead-boron-selenium oxide in the lead-boron-selenium glass frit is completely amorphous as produced from a molten state during firing.

In other embodiments, lead-boron-selenium oxide in the lead-boron-selenium glass frit is partly amorphous and partly crystalline as produced from a molten state during firing, and the content of the crystallized lead-boron-selenium oxide in the lead-boron-selenium glass frit accounts for less than 1.5% of the total weight of lead-boron-selenium oxide.

In some embodiments, the conductive component can be selected from a mixture of any one or more of silver element (e.g., silver powder), silver alloy, and silver salt, or silver derivatives. Other metals such as copper and palladium or derivatives of these metals can also be contained.

In some other embodiments, the percentage by weight of the conductive component of the total solid in the conductive paste composition ranges from 87% to 99%, 88% to 98%, 90% to 97%, 91% to 96%, or 92% to 95%, and further ranges from 93% to 94%.

In some embodiments, the conductive paste composition contains Cd element and/or Tl element below 100 ppm. Cd element and/or Tl element have certain toxicity, if the paste contains excessive highly toxic substances, it will be harmful to the environment, so it is preferable not to add Cd element and/or Tl element.

The first conductive paste composition provided by some embodiments of the present disclosure is used to prepare photovoltaic devices such as an n-type crystalline silicon solar cell. Wherein, the conductive paste composition forms a conductive structure in the n-type crystalline silicon solar cell that fires through the passivation film of the n-type crystalline silicon solar cell during firing and forms an electrical contact with a p-type semiconductor.

Some embodiments of the present disclosure provide a preparation method for an n-type crystalline silicon solar cell electrode, comprising steps of:

(1) providing a semiconductor substrate, wherein the semiconductor substrate has an n-type crystalline silicon substrate (also known as n-type lightly doped substrate), a p-type doped emitter disposed on a surface of the n-type crystalline silicon substrate, and a passivation film deposited on a surface of the p-type doped emitter;

(2) applying the above conductive paste composition onto at least a portion of the surface of the passivation film on the surface of the p-type doped emitter; and (3) firing the semiconductor substrate and the conductive paste composition thereon, so that the conductive paste composition etches and fires through the passivation film during firing to form a conductive structure electrically contacting the p-type doped emitter, thereby obtaining the n-type crystalline silicon solar cell electrode. The n-type crystalline silicon solar cell electrode is one of the components of the n-type crystalline silicon solar cell.

The sequence numbers of the above steps are not regarded as the only limitation on the sequence of the steps.

In Step (1), in some embodiments, the n-type crystalline silicon substrate is doped and diffused with a phosphorus source on the backside of the crystalline silicon wafer to form a high concentration $N^+$ region, so it is referred to as an n-type back surface field (BSF), and phosphorus is used as a dopant; the p-type semiconductor is part of the crystalline silicon wafer with p-type doping (e.g., boron) on the front side, so it is referred to as a p-type emitter, which forms a pn junction with the n-type crystalline silicon substrate. The front side is defined as the side of the n-type crystalline silicon solar cell that receives direct sunlight (also known as the light-facing side), and the back side is defined as the side of the n-type crystalline silicon solar cell that is not exposed to direct sunlight (also known as the backlight side).

In Step (2), in some embodiments, the conductive paste composition is applied onto at least a portion of the surface of the passivation film on the surface of the p-type semiconductor in a pattern.

Some embodiments of the present disclosure provide an n-type crystalline silicon solar cell electrode, comprising:
a semiconductor substrate having an n-type crystalline silicon substrate, a p-type doped emitter disposed on the surface of the n-type crystalline silicon substrate, and at least one passivation film deposited on the surface of the p-type doped emitter; and
a conductive structure that fires through at least a portion of the passivation film and forms an electrical contact with the p-type doped emitter, wherein the conductive structure is formed of the above conductive paste composition.

Some embodiments of the present disclosure provide an n-type crystalline silicon solar cell, comprising the above n-type crystalline silicon solar cell electrode. In some embodiments, the above n-type crystalline silicon solar cell can be a photovoltaic device such as an n-PERT solar cell or an n-TOPCon solar cell.

[A Second Conductive Paste and its Preparation Method and Use]

Some embodiments of the present disclosure also provide a second conductive paste composition for forming an electrical contact with a p-type semiconductor in an n-type crystalline silicon solar cell. The composition of the above first conductive paste composition same as that of the second conductive paste composition in this section can be incorporated herein by reference, and will not be repeated. Compared with the above first conductive paste composition, the conductive paste composition in this section does not contain highly toxic elements such as lead, cadmium and thallium, therefore, it will not harm the human body and the environment, and is beneficial for recycling. In addition, the second conductive paste composition and its glass frit in this section do not contain any form of tellurium element (Te), such as tellurium oxide ($TeO_2$).

Specifically, the second conductive paste composition in this section includes:

(1) a bismuth-boron-selenium glass frit accounting for 0.5% to 10% (percentage by weight) of the total solid in the above conductive paste composition;

(2) a conductive component accounting for 87% to 99% (percentage by weight) of the total solid;

(3) an aluminum elemental component accounting for 0.5% to 3% (percentage by weight) of the total solid; and (4) an organic medium.

Wherein, the bismuth-boron-selenium glass frit, the conductive component, and the aluminum elemental component are used as the total solid in the conductive paste composition, and the sum of the percentages by weight of the three is 100%.

In some embodiments, based on the total weight of the dry weight of the bismuth-boron-selenium glass frit, the bismuth-boron-selenium glass frit at least contains 50% to 90% of $Bi_2O_3$, 2% to 35% of $B_2O_3$, and 0.1% to 15% of $SeO_2$. However, in some other embodiments, based on the total weight of the dry weight of the bismuth-boron-selenium glass frit, the bismuth-boron-selenium glass frit further contains 0.1% to 25% of additives, wherein the additives are selected from any one or more of the group consisting of $SiO_2$, $BiF_3$, $AgO_2$, $Ag_2O$, $AgO$, $ZnO$, $MgO$, $CaO$, $Al_2O_3$, $Li_2O$, $Na_2O$, $K_2O$, $Rb_2O$, $Ce_2O$, and $Fe_2O_3$. The additives also do not contain oxides or halides of highly toxic elements.

In some embodiments, based on the total weight of the dry weight of the bismuth-boron-selenium glass frit, the content of $Bi_2O_3$ in the bismuth-boron-selenium glass frit ranges from 52% to 90%, 55% to 88%, 58% to 85%, 60% to 80%, or 66.6% to 75%, 68.9% to 71.3%, and further ranges from 70% to 71%.

In some embodiments, based on the total weight of the dry weight of the bismuth-boron-selenium glass frit, the content of $B_2O_3$ in the bismuth-boron-selenium glass frit ranges from 2% to 20%, 3% to 18%, 5% to 16%, 7% to 15%, 10.5% to 12%, 10.9% to 11.6%, or 11.1% to 11.3%.

In some embodiments, based on the total weight of the dry weight of the bismuth-boron-selenium glass frit, the content of $SeO_2$ in the bismuth-boron-selenium glass frit ranges from 0.1% to 15%, 0.2% to 14%, 1% to 13%, 2% to 12.4%, 3.1% to 9.3%, or 3.5% to 6.2%. The adjustment of the content of above each component needs to be ensured that the sum of the content of each component of the bismuth-boron-selenium glass frit is 100%.

In some embodiments, based on the total weight of the dry weight of the bismuth-boron-selenium glass frit, the bismuth-boron-selenium glass frit also contains 0.1% to 5% of $Li_2O$.

In some embodiments, based on the total weight of the dry weight of the bismuth-boron-selenium glass frit, the bismuth-boron-selenium glass frit also contains 0.1% to 5% of $Na_2O$.

In some embodiments, based on the total weight of the dry weight of the bismuth-boron-selenium glass frit, the bismuth-boron-selenium frit glass also contains 0.1% to 20% of ZnO.

In some embodiments, the conductive component is selected from a mixture of any one or more of silver element (e.g., silver powder), silver alloy, and silver salt.

In some embodiments, bismuth-boron-selenium oxide in the bismuth-boron-selenium glass frit is completely amorphous as produced from a molten state during firing.

In other embodiments, bismuth-boron-selenium oxide in the bismuth-boron-selenium glass frit is partly amorphous and partly crystalline as produced from a molten state during firing, and the content of crystallized bismuth-boron-selenium oxide in the bismuth-boron-selenium glass frit accounts for less than 1.5% of the total weight of bismuth-boron-selenium oxide.

Some embodiments of the present disclosure also provide a use of a conductive paste composition in an n-type crystalline silicon solar cell. Wherein, the conductive paste composition etches and fires through the passivation film of the n-type crystalline silicon solar cell during firing, and forms electrical contact with the p-type doped emitter of the n-type crystalline silicon solar cell.

Some embodiments of the present disclosure also provide a preparation method for an n-type crystalline silicon solar cell electrode, comprising steps of:
(1) providing a semiconductor substrate, wherein the semiconductor substrate has an n-type crystalline silicon substrate, a p-type doped emitter disposed on a surface of the n-type crystalline silicon substrate, and at least one passivation film deposited on a surface of the p-type doped emitter;
(2) applying the above conductive paste composition onto at least a portion of the surface of the passivation film; and
(3) firing the semiconductor substrate and the conductive paste composition thereon, so that the conductive paste composition etches and fires through the passivation film during firing to form a conductive structure (also known as a silver-aluminum electrode) electrically contacting the p-type doped emitter, thereby obtaining the n-type crystalline silicon solar cell electrode.

In Step (1), in some embodiments, the n-type crystalline silicon substrate is doped and diffused with a phosphorus source on the backside of the crystalline silicon wafer to form a high concentration $N^+$ region, so it is referred to as an n-type back surface field (BSF), and phosphorus is used as a dopant; the p-type semiconductor is part of the silicon wafer with p-type doping (e.g., boron) on the front side, so it is referred to as a p-type emitter, which forms a pn junction with the n-type crystalline silicon substrate.

In some embodiments, the second conductive paste composition is applied onto at least a portion of the surface of the passivation film in a pattern.

Some embodiments of the present disclosure also provide an n-type crystalline silicon solar cell electrode, comprising:
a semiconductor substrate having an n-type crystalline silicon substrate, a p-type doped emitter disposed on the surface of the n-type crystalline silicon substrate, and at least one passivation film deposited on the surface of the p-type doped emitter; and
a conductive structure that fires through at least a portion of the passivation film and forms an electrical contact with the p-type doped emitter, wherein the conductive structure is formed of the above conductive paste composition.

Some embodiments of the present disclosure also provide an n-type crystalline silicon solar cell, comprising the above n-type crystalline silicon solar cell electrode.

In some embodiments, the above n-type crystalline silicon solar cell can be a photovoltaic device such as an n-PERT solar cell or an n-TOP Con solar cell.

Due to the adoption of the above technical solutions, some embodiments of the present disclosure have achieved the following technical effects:

First, the conductive paste composition in some embodiments of the present disclosure contains a glass frit with a desired low Tg point, and does not contain oxide components that can over-oxidize the aluminum elemental component in the silver-aluminum paste. In addition, the conductive paste composition can etch the passivation film of the photovoltaic device at a controllable rate and in the firing process, the silver-aluminum paste can form a silver-aluminum electrode that fires through the passivation film of the photovoltaic device and forms a decent electrical contact with the p-type semiconductor. Therefore, the resulting photovoltaic device has a decent fill factor (FF) and a photoelectric conversion efficiency (n).

Second, the conductive paste composition in some embodiments of the present disclosure does not contain highly toxic elements such as cadmium and thallium, so the resulting photovoltaic device has a low toxicity, which is beneficial to reduce the harm to the human body and the environment, and it is also convenient for recycling.

DESCRIPTION OF DRAWINGS

In order to illustrate technical solutions in the embodiments of the present disclosure, the accompanying figures in the embodiments will be introduced briefly hereafter. It is obvious that the accompanying figures in the following description are merely part of the embodiments of the present disclosure. For those skilled in the art, other figures can also be obtained from these figures without making inventive efforts.

FIG. 1 only shows the case where the first conductive paste composition is used. In fact, the conductive paste composition can be the above first conductive paste composition (containing a lead-boron-selenium glass frit), or can be the above second conductive paste composition (containing a bismuth-boron-selenium glass frit).

FIG. 2 only shows the case where the first conductive paste composition is used. In fact, the conductive paste composition can be the above first conductive paste composition (containing a lead-boron-selenium glass frit), or can be the above second conductive paste composition (containing a bismuth-boron-selenium glass frit).

Figure 1:
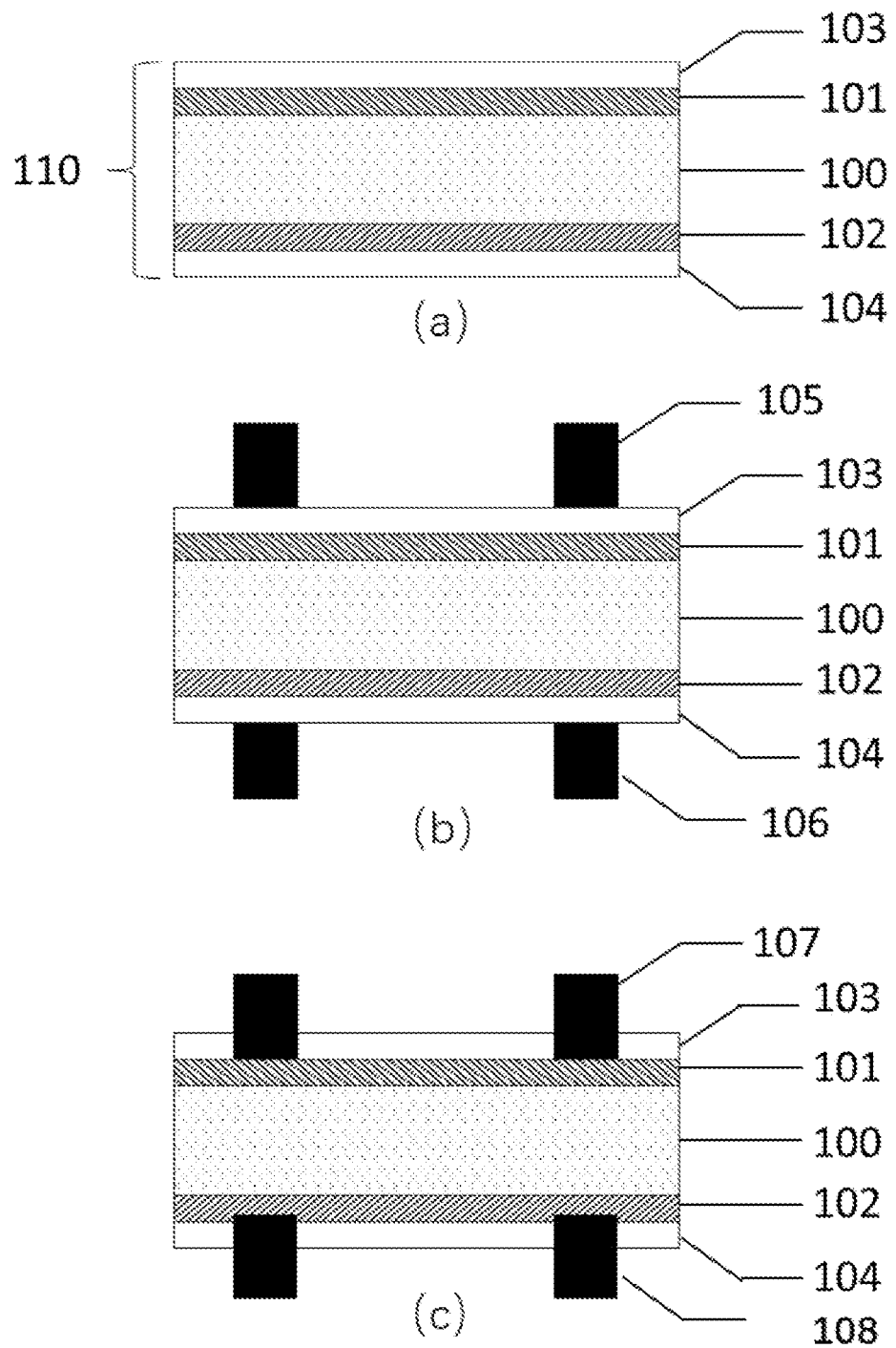
FIG. 1 is a sectional view of an n-type solar cell prepared by applying the conductive paste composition in some embodiments of the present disclosure.

The reference numbers in the figures:
Semiconductor substrate 110, n-type crystalline silicon substrate 100 (also known as n-type lightly doped substrate), front side p-type emitter 101 (p-type semiconductor), back surface field 102 ($n^+$ heavily doped semiconductor), front side passivation film 103, back side passivation film 104, front side silver-aluminum paste 105, back side metallization paste 106, front side conductive structure 107, back side conductive structure 108.

Semiconductor substrate 210, n-type crystalline silicon substrate 200, front side p-type emitter 201, tunneling passivation film 202a, $n^+$ polysilicon layer 202b, front side passivation film 203, back side passivation film 204, front side silver-aluminum paste 205, back side metallization paste 206, front side conductive structure 207, back side conductive structure 208.

DETAILED DESCRIPTION OF PREFERRED EMBODIMENTS

The technical solutions of the present disclosure will be described clearly and completely below. Obviously, the described embodiments are only a part of the embodiments of the present disclosure, rather than all the embodiments. Based on the embodiments of the present disclosure, all other embodiments obtained by those skilled in the art without making inventive efforts fall within the scope of the present disclosure.

The present disclosure provides a conductive paste composition and a preparation method and a use thereof. Wherein, the conductive paste composition can also be referred to as a thick film paste or a thick film paste composition, which includes a first conductive paste composition (containing a lead-boron-selenium glass frit) and a second conductive paste composition (containing a bismuth-boron-selenium glass frit). Each of them will be described in detail below. It should be noted that the description order of the following embodiments is not intended to limit the preferred order of the embodiments.

[A First Conductive Paste Composition]

Some embodiments of the present disclosure provide a first conductive paste composition for forming a low-resistance electrical contact with a p-type semiconductor of a photovoltaic device.

The first conductive paste composition provided by some embodiments of the present disclosure includes the following components:

(1) a lead-boron-selenium glass frit;
(2) a conductive component;
(3) an aluminum elemental component;
(4) an organic medium.

Wherein, the lead-boron-selenium glass frit, the conductive component, and the aluminum elemental component are used as a solid component in the conductive paste composition, and the sum of the percentages by weight of the solid in the conductive paste composition is 100%. The organic medium acts as a dispersed phase in the conductive paste composition and provides a printing property.

Each component is described separately below.

Lead-boron-selenium glass frit:

In some embodiments, the lead-boron-selenium glass frit is a composition with glass components, which can account for 0.5% to 10% of the total solid in the conductive paste composition. In some other embodiments, the ratio of the lead-boron-selenium glass frit to the total solid in the conductive paste composition also ranges from 0.8% to 9.8%, 1% to 9.5%, or 1.5% to 9%, and further ranges from 2% to 8%, 3% to 7%, 4% to 6%, or 5% to 5.5%. The percentage of each component in the conductive paste composition is expressed in a percentage by weight (wt %), and the following is the same. The adjustment of the ratio of the lead-boron-selenium glass frit in the total solid of the conductive paste composition needs to be ensured that the sum of the percentages by weight of each component in the conductive paste composition is 100%.

In some embodiments, the lead-boron-selenium glass frit at least contains the following components: 50% to 85% of PbO, 2% to 34% of $B_2O_3$, and 0.1% to 16% of $SeO_2$. The percentage of each component in the frit is expressed in a percentage by weight (wt %), which is calculated based on the total weight of the dry weight of the lead-boron-selenium glass frit. The adjustment of the ratio of each component in the lead-boron-selenium glass frit needs to be ensured that the sum of the ratios of each component in the total dry weight of the lead-boron-selenium glass frit is 100%.

Wherein, in some embodiments, based on the total weight of the dry weight of the lead-boron-selenium glass frit, the content (wt %) of PbO in the lead-boron-selenium glass frit ranges from 51.0% to 82.0%, 55% to 75%, or 65.9% to 74.5%, and further ranges from 68.8% to 73.1% %, or 70% to 71.7%. The adjustment of the content needs to be ensured that the sum of the content of each component of the lead-boron-selenium glass frit is 100 wt %.

In some embodiments, based on the total weight of the dry weight of the lead-boron-selenium glass frit, the content of $B_2O_3$ in the lead-boron-selenium glass frit ranges from 3% to 32%, 4% to 30%, 2% to 20%, 6.8% to 10%, 7.1% to 7.6%, or 7.4% to 7.5%. The adjustment of the content needs to be ensured that the sum of the content of each component of the lead-boron-selenium glass frit is 100 wt %.

In some embodiments, based on the total weight of the dry weight of the lead-boron-selenium glass frit, the content of $SeO_2$ in the lead-boron-selenium glass frit ranges from 0.2% to 15%, 0.5% to 13.1%, 1% to 10%, 1.9% to 9.4%, 2.1% to 8.1%, or 3.7% to 5.6%. The adjustment of the content needs to be ensured that the sum of the content of each component of the lead-boron-selenium glass frit is 100 wt %.

In some embodiments, in addition to the above three basic components, the lead-boron-selenium glass frit can also contain additives.

The naming of the lead-boron-selenium glass frit in various embodiments of the present disclosure does not mean that this type of the glass frit only contains oxides of three elements: lead, boron and selenium, and it can also contain other components, such as other elements or additives. Because these three elements belong to the basic components in this type of the glass frit, and for the convenience of distinguishing it from the bismuth-boron-selenium glass frit, the above naming is carried out herein. The naming of the bismuth-boron-selenium glass frit is the same.

In some embodiments, the additives are used for modification of the glass system, so they are also referred to as glass modifiers. During the preparation of the glass frit, a glass former is used to form an initial network structure of the glass. When the additives are incorporated into the glass network structure, the initial network structure formed by the glass former is changed, thereby changing the properties such as the thermal properties of the glass. The additives can be selected from oxides of any one of alkali metal elements, alkaline earth metal elements, transition metal elements, or a mixture of oxides of several elements. For example, the additives can be selected from any one or more of the group consisting of $PbF_2$, $BiF_3$, $SiO_2$, $Bi_2O_3$, $AgO_2$, $Ag_2O$, $AgO$, $ZnO$, $MgO$, $CaO$, $Al_2O_3$, $Li_2O$, $Na_2O$, $K_2O$, $Rb_2O$, $Ce_2O$, and $Fe_2O_3$. In some embodiments, the additives can be selected from a combination of $SiO_2$, $Bi_2O_3$, $Li_2O$, $Na_2O$, $Al_2O_3$, or $ZnO$. The content of each component in the additives can be adjusted accordingly depending on the desired glass property. Both the fluoride ion and the oxygen ion in the additives are anions and can be used in combination with the above metal cations.

In some embodiments, based on the total weight of the dry weight of the lead-boron-selenium glass frit, the content of the additives in the lead-boron-selenium glass frit ranges from 0.5% to 20%, 5% to 19%, 8% to 17%, 10% to 16%, 14.2% to 15.7%, or 14.7% to 15.3%. The percentage is a percentage by weight. The adjustment of the content needs to be ensured that the sum of the content of each component of the lead-boron-selenium glass frit is 100 wt %.

It should be ensured that the various components of the glass frit, including the base components and the additives, are not reactive to the aluminum powder in the conductive paste composition. More specifically, it is ensured that each component in the glass frit does not react with the aluminum powder in the conductive paste, otherwise it will affect the electrical conductivity and the efficiency of the resulting photovoltaic device. Inventors of the present disclosure surprisingly found in the research that $SeO_2$ added to the lead-boron-selenium glass frit can reduce the Tg point of the glass frit without excessively oxidizing the aluminum powder in the silver-aluminum paste, which enables the photovoltaic device such as a solar cell to form a low-resistance electrical contact. Therefore, the embodiments of the present disclosure creatively propose a lead-boron-selenium glass frit to replace the current lead-silicon-boron glass frit.

In some embodiments, the conductive paste composition and the lead-boron-selenium glass frit of the present disclosure contain no more than 1.2 wt % $TeO_2$, or contain no more than 1.0 wt % $TeO_2$, or contain no more than 0.5 wt % $TeO_2$. The percentage by weight is the wt % of $TeO_2$ as a percentage of the total dry weight of the lead-boron-selenium glass frit. The adjustment of the content needs to be ensured that the sum of the content of each component of the lead-boron-selenium glass frit is 100 wt %.

In some other embodiments, the conductive paste composition and the lead-boron-selenium glass frit of the present disclosure do not contain any form of tellurium (Te), such as $TeO_2$.

In some embodiments, lead-boron-selenium oxide in the lead-boron-selenium glass frit can be completely amorphous or can be partly amorphous and partly crystalline as produced from the molten state during firing. The content of the crystallized lead-boron-selenium oxide in the lead-boron-selenium glass frit accounts for less than 1.5% of the total weight of lead-boron-selenium oxide, and can also account for less than 1%, so as to facilitate the subsequent cell metallization process.

In some other embodiments, the lead-boron-selenium glass frit of the present disclosure can also contain Cd element and/or Tl element. Cd element and/or Tl element can also play a role in reducing the Tg point of the frit, but due to its high toxicity, the addition amount should not be too much. Thus, the lead-boron-selenium glass frit can contain CdO or $Tl_2O_3$ below 100 ppm, CdO or $Tl_2O_3$ below 50 ppm, or CdO or $Tl_2O_3$ below 20 ppm, or can also contain no CdO or $Tl_2O_3$.

In some other embodiments, the preparation method for the lead-boron-selenium glass frit comprises steps of: proportioning the above oxide according to the required weight ratio, and then firing at high temperature to bring it to a molten state; after mixing the molten materials evenly, quenching the molten materials rapidly, and then pulverizing the quenched material to form a lead-boron-selenium glass frit in a powder form. The particle size of the lead-boron-selenium glass frit powder should not be too large, and, otherwise it is not suitable for mixing evenly during the preparation of the conductive paste, so that the $D_{50}$ of the lead-boron-selenium glass frit powder can range from 0.5 to 3.0 μm.

Conductive Component:

In some embodiments, the conductive component is used to conduct current after the photovoltaic device is formed. The conductive component can be selected from a mixture of any one or more of silver element, copper element, silver alloy, copper alloy, and silver salt. If the conductive component is selected from silver salt, the silver salt can be selected from AgCl, $AgNO_3$, $AgOOCH_3$ (silver acetate), silver trifluoroacetate or silver orthophosphate ($Ag_3PO_4$).

In some embodiments, the conductive component can exist in a form of such as flakes, granules, colloids. If a granular form is presented, the particle size of the conductive component should not be too large, otherwise the dispersibility will be affected. In some embodiments, the average particle size of the conductive component can be in a range of a micron scale, for example, it is ≤15 μm, ≤10 μm, ≤5 μm, or ≤2 μm, or it ranges from 0.1 μm to 1 μm. In other embodiments, the average particle size of the conductive component can be in a range of a nanoscale, for example, it is ≤800 nm, ≤700 nm, ≤500 nm, ≤300 nm, ≤200 nm, or ≤50 nm, or it ranges from 10 nm to 20 nm.

In some other embodiments, the percentage by weight of the conductive component in the total solid of the conductive paste composition ranges from 87% to 99%, 88% to 98%, 90% to 97%, 91% to 96%, or 92% to 95%, or it further ranges from 93% to 94%. The adjustment of the ratio of the conductive component of the total solid in the conductive paste composition needs to be ensured that the sum of the percentages by weight of each component in the conductive paste composition is 100%.

Aluminum Elemental Component:

In some embodiments, the aluminum element is a necessary component in the conductive paste composition. The aluminum elemental component can be an aluminum powder. The aluminum elemental component and the conductive component are dispersed in the organic medium, and during a high temperature firing process, the aluminum powder can assist in forming a low-resistance ohmic contact. For example, if the conductive component is silver element, the n-type conductive paste composition contains a silver-aluminum paste (Ag/Al paste); the p-type conductive paste does not contain metal aluminum element, so it only contains a silver paste (Ag paste).

During the firing process in the preparation of an n-type photovoltaic device, one of the roles of the aluminum of the conductive paste composition is to facilitate the formation of an electrical contact with the p-type semiconductor (e.g., the p-type emitter) of the photovoltaic device, so it is very important to maintain the metallic aluminum during the firing process. This electrical contact needs to have a low resistivity (e.g., 0.5 to 5 mohm/$cm^2$) to improve the efficiency of the photovoltaic device. The conductive paste composition contains an oxidizing component (e.g., a glass frit) for etching the passivation film. If the oxidizing component excessively reacts with the aluminum elemental component during the firing process, the resistance value of the materials in the conductive paste composition and the p-type emitter will be increased, thereby reducing the efficiency of the photovoltaic device. Thus, the oxidizing component in the conductive paste composition cannot over-oxidize aluminum during the firing process.

The lead-boron-selenium glass frit of the present disclosure contains selenium (Se) oxide, and the melting point of selenium oxide is lower than that of tellurium (Te) oxide in the same family, which helps to reduce the melting point and improve the fluidity of the lead-boron-selenium glass frit, so as to facilitate screen printing and etching of the passivation films. In addition, $SeO_2$ contained in the lead-boron-selenium glass frit will not over-oxidize aluminum like $TeO_2$, which is beneficial to the formation of a low-resistance electrical contact between the aluminum element and the p-type emitter, thereby improving the efficiency of the photovoltaic device.

In some embodiments, in the first conductive paste composition, the aluminum elemental component can account for 0.5% to 3%, 0.8% to 2.9%, 0.9% % to 2.8%, or 1.0% to 2.5% of the total solid in the first conductive paste composition, or can further account for 1.2% to 2.4%, 1.5% to 2.1%, or 1.6% to 2.0% of the total solid in the first conductive paste composition. The adjustment of the ratio of the aluminum elemental component of the total solid in the conductive paste composition needs to be ensured that the sum of the percentages by weight of each component in the conductive paste composition is 100%.

In some embodiments, the aluminum elemental component can be mixed with other components of the conductive paste composition in a powder form. The average particle size of the aluminum elemental component can be in a micron scale. As a micron-scale aluminum elemental component, the particle size of the aluminum elemental component is ≤5 μm, ≤4 μm, ≤3 μm, or ≤2 μm, or ranges from 1 μm to 5 μm.

Organic Medium:

In some embodiments, with respect to the solid composed of the conductive component, the lead-boron-selenium glass frit and the aluminum elemental component, the organic medium is used as a liquid phase in the conductive paste composition to disperse the above conductive component, the lead-boron-selenium glass frit and the aluminum elemental component to form a paste with a certain viscosity. The viscosity and the rheological property of the paste can not only make the above conductive component, the lead-boron-selenium glass frit and the aluminum elemental component dispersed in the paste stably for a long time, but also make the conductive paste composition dispensed on the printing screen, and to form a desired pattern onto the surface of the passivation film of the photovoltaic device by screen printing.

In some embodiments, during the high temperature firing process after screen printing, the organic medium may be burnout. The organic medium can include polymers and organic solvents. The polymers can include celluloses, resins, esters, etc. The organic solvents can include α-terpene, β-terpene, dibutyl phthalate, diethylene glycol monobutyl ether, diethylene glycol butylether acetate, hexanediol, etc. The celluloses include ethyl celluloses, ethyl hydroxyethyl celluloses, or mixtures thereof. The resins include wood rosin or phenolic resins, or mixtures thereof. The esters include lower alcohols such as polymethacrylate.

In some embodiments, the content of the organic medium in the conductive paste composition depends on the required viscosity, rheological property and physical property of the conductive paste composition as a whole. The content of the organic medium can account for 6% to 12%, 7% to 11%, or 8% to 10% of the total weight of the conductive paste composition. The percentage is a percentage by weight.

In some embodiments, the conductive paste composition (the n-type conductive paste composition) of the present disclosure includes a lead-boron-selenium glass frit (also known as Pb—B—Se oxide), a silver powder, an aluminum powder, and an organic medium. The lead-boron-selenium glass frit at least contains lead, boron and selenium, and is used to etch or corrode the passivation film during firing at a high temperature. The organic medium belongs to a dispensed phase and is used to disperse the above lead-boron-selenium glass frit, silver powder and aluminum powder. The conductive paste composition in the embodiments of the present disclosure is capable of etching and firing through the passivation film of the photovoltaic device and forming a low-resistance contact with the p-type semiconductor after firing. This is an effect that is difficult to achieve by current conductive pastes without aluminum. One of the reasons is that it is difficult for conductive pastes without aluminum powder to form a low-resistance electrical contact with the p-type semiconductor after firing through the passivation film of the photovoltaic device, which may ultimately affect the efficiency of the photovoltaic device.

The tellurium oxide in the lead-tellurium glass frit can reduce the softening point of the glass system and enhance the fluidity of the glass system. However, the tellurium oxide will oxidize the aluminum element in the silver-aluminum paste to an aluminum oxide ($Al_2O_3$), resulting in failure to form a decent electrical contact within the photovoltaic device, which affects the efficiency of the photovoltaic device. Thus, the tellurium oxide cannot be used in the n-type conductive paste containing the silver-aluminum paste. Although selenium and tellurium are elements in the same family, the inventors surprisingly found that the selenium oxide does not oxidize the aluminum metal element in the silver-aluminum paste like the tellurium oxide in the subsequent firing process, which can satisfy the requirement for the n-type conductive paste composition to form a low-resistance contact with the p-type semiconductor.

The inventors also found that the selenium oxide belongs to a type of glass formers, which itself has a lower melting temperature, and can change the thermal properties of the glass frit after being added. Compared with the n-type conductive paste composition without selenium oxide, the addition of selenium oxide can reduce the Tg point and the melting temperature, and improve the fluidity, which can meet the requirement for passivation film etching. Because during the firing process, the glass frit can be softened and flowed at a faster rate, which is beneficial to achieve the controllable etching of the passivation film. Although tellurium (Te) added to lead-tellurium frit (Pb—Te) can also increase the fluidity and reduce the softening point, as mentioned above, tellurium oxide can oxide the aluminum metal element, thereby reducing the contact performance of aluminum. Thus, tellurium oxide is not suitable as an additive to add to the lead-boron-selenium glass frit in the embodiments of the present disclosure.

In addition, although thallium (Tl) can be used to reduce the melting temperature and improve the fluidity of the glass frit in the conductive paste composition, it cannot be added in a large amount due to its strong toxicity, otherwise it is harmful to the human body and the environment, and the recovery cost is higher. The selenium oxide used in some embodiments of the present disclosure has little toxicity, and can replace thallium oxide to reduce the melting temperature and improve the fluidity. However, this does not mean that Se element cannot be used in combination with Cd element and/or Tl element. In some embodiments of the present disclosure, Cd element and/or Tl element (such as CdO or $Tl_2O_3$) can be added to the lead-boron-selenium glass frit (containing Se element), but it is necessary to ensure that the content of Cd element and/or Tl element is below 100 ppm, or even less, for example, below 10 ppm. In some other embodiments of the present disclosure, Cd element and/or Tl element in any form, including but not limited to CdO or $Tl_2O_3$, can also be directly added to the conductive paste composition (containing Se element), but it is still necessary to ensure that the conductive paste composition contains Cd element and/or Tl element below 100 ppm to avoid excessive toxicity. By the above method, the conductive paste composition can be controlled within the range of weak toxicity.

Therefore, the lead-boron-selenium glass frit (containing Pb—B—Se oxide) in various embodiments of the present disclosure can be used as an alternative for the known lead-silicon-boron glass frit (containing Pb-B-Se oxide) and used with silver-aluminum paste to prepare an n-type conductive paste composition, which can fires through the passivation film and form a decent electrical contact with the p-type semiconductor under the passivation film during the preparation of the photovoltaic device.

Preparation Method for the First Conductive Paste Composition:

Some embodiments of the present disclosure also provide a preparation method for the above first conductive paste composition, comprising steps of:

Mixing the conductive component, the lead-boron-selenium glass frit and the aluminum elemental component according to the above proportion, dispensing them into a certain amount of the organic medium, and forming the above first conductive paste composition after even dispersion. The adjustment of the ratio of the lead-boron-selenium glass frit, the conductive component and the aluminum elemental component should be ensured that the sum of the percentages by weight of the three components of the total solid in the conductive paste composition is 100%.

Use of the First Conductive Paste Composition:

The conductive paste composition in some embodiments of the present disclosure can be used for preparing a photovoltaic device, such as a solar cell. For example, the conductive paste composition rapidly etches the passivation film of the photovoltaic device during the firing process, and finally fires though the passivation film to form a low-resistance electrical contact with the p-type semiconductor of the photovoltaic device. The p-type semiconductor can preferably be a p-type emitter, made from a silicon substrate by a diffusion method.

The First Photovoltaic Device:

As shown in FIG. 1, some embodiments of the present disclosure provide a first photovoltaic device, which is an n-PERT solar cell (passivated emitter, rear totally diffused), which utilizes the first conductive paste composition of the above embodiment during preparation.

Wherein, as shown in FIG. 1c, the n-PERT solar cell includes structures of:

(1) the n-type crystalline silicon substrate 100, located in the middle of the n-PERT solar cell;
(2) the front side p-type emitter 101, located on the front side of the n-type crystalline silicon substrate 100;
(3) the front side passivation film 103, deposited on the surface of the front side p-type emitter 101;
(4) the back surface field 102, located on the back side of the n-type crystalline silicon substrate 100;
(5) the back side passivation film 104, deposited on the surface of the back surface field 102;
(6) the front side conductive structure 107, which fires through at least a portion of the front side passivation film 103 on the surface of the front side p-type emitter 101 and forms an electrical contact with the front side p-type emitter 101;
(7) the back side conductive structure 108, which fires through at least a portion of the back side passivation film 104 on the surface of the back surface field 102 and forms an electrical contact with the back surface field 102.

Wherein, the above serial numbers do not indicate the relative positional relationship between the respective structures.

The n-type crystalline silicon substrate 100, the front side p-type emitter 101, the back surface field 102, the front side passivation film 103 and the back side passivation film 104 are collectively referred to as the semiconductor substrate 110 (also known as the n-type semiconductor substrate).

The n-type crystalline silicon substrate 100 is also referred to as an n-type lightly doped substrate, which is an n-type solar cell blue film formed by lightly doped diffusion on the crystalline silicon wafer using a phosphorus source.

The front side p-type emitter 101 is also referred to as the p-type semiconductor, and is formed by doping the n-type crystalline silicon substrate 100 with a trivalent element by means of a diffusion method. The trivalent element can be boron or gallium. The acceptor impurity source for providing boron element can include boron trioxide, boron nitride, trimethyl borate, tripropyl borate, boron tribromide or diborane, etc. Gallium is the same.

The back surface field 102 is formed by doping the n-type crystalline silicon substrate 100 with a pentavalent element (e.g., phosphorus) by means of a diffusion method. The donor impurity source for providing phosphorus element can include phosphorus pentoxide, phosphoryl chloride, phosphorus trichloride, or hydrogen phosphide, etc.

The front side passivation film 103 and the back side passivation film 104 can also be referred to as an insulating layer or an anti-reflection layer, and can be made from silicon nitride, aluminum oxide, titanium oxide, or silicon oxide, or any combination thereof. The passivation film can be deposited on one or both surfaces of the n-type crystalline silicon substrate 100 by vapor deposition, sputtering or other methods.

The front side conductive structure 107 is formed using the first conductive paste composition. The first conductive paste composition (e.g., the front side silver-aluminum paste 105 shown in FIG. 1) is applied onto at least a portion of the surface of the front side passivation film 103 in a desired patterned form, and the first conductive paste composition etches and fires through the surface of the front side passivation film 103 in contact with the first conductive paste composition during the subsequent sintering, thereby forming an electrical contact with the front side p-type emitter 101, so as to form the front side conductive structure 107 (also known as a front side silver-aluminum electrode) in the form of a conductive metal contact.

The back side conductive structure 108 can utilize a metallization silver paste (such as a silver paste containing a Pb—Te—O glass frit powder) used in the p-type crystalline silicon cell on the market. The conductive paste composition (e.g., the back side conductive structure 108) is applied onto at least a portion of the surface of the back side passivation film 104 in a desired patterned form, and the conductive paste composition etches and fires through the surface of the back side passivation film 104 in contact with the first conductive paste composition during the subsequent firing, thereby forming an electrical contact with the back surface field 102, so as to form the back side conductive structure 108 (also known as a back side silver electrode) in the form of a conductive metal contact.

One of the purposes of the above firing process is to burnout the organic medium in the first conductive paste composition and fire the metal powder. Firing can be carried out in air or an oxygen-containing atmosphere. During firing, the organic medium in the first conductive paste composition will be burnout, and the glass frit therein will gradually etch the portion of the passivation film in contact with the first conductive paste composition. After the etching is completed, the first conductive paste composition fires through the passivation film, and the conductive structure is formed after cooling. The conductive paste composition contains the silver-aluminum paste, wherein the silver component has a decent conductivity. One of the roles of the aluminum powder is to facilitate the formation of a low-resistance electrical contact between the front side p-type emitter 101 and the front side conductive structure 107, thereby enabling the photovoltaic device to have a desired efficiency.

As shown in FIG. 1a to 1c, the preparation method for the above n-PERT solar cell comprises steps of:
(1) providing the n-type crystalline silicon substrate 100, wherein the n-type crystalline silicon substrate 100 is formed by lightly doped diffusion on the crystalline silicon wafer (e.g., a polycrystalline silicon wafer or a single crystalline silicon wafer) using a phosphorus source;
(2) doping the front side of the n-type crystalline silicon substrate 100 with a trivalent element (e.g., boron or gallium) by a diffusion method, so as to form the front side p-type emitter 101 on the front side of the n-type crystalline silicon substrate 100; doping the back side of the n-type crystalline silicon substrate 100 with a pentavalent element (e.g., phosphorus) to form the back surface field 102;
(3) depositing the front side passivation film 103 on the surface of the front side p-type emitter 101, and depositing the back side passivation film 104 on the surface of the back surface field 102;
(4) applying the first conductive paste composition as the front side silver-aluminum paste 105 onto at least a portion of the surface of the front side passivation film 103 in a patterned form. Applying a metallization silver paste for the p-type crystalline silicon cell on the market, such as a silver paste containing a Pb—Te—O glass frit powder, as the back side metallization paste 106 onto at least a portion of the surface of the back side passivation film 104 in a patterned form;
(5) firing is performed so that the front side silver-aluminum paste 105 etches and fires through the surface of the front side passivation film 103 in contact with the front side silver-aluminum paste 105, thereby forming an electrical contact with the front side p-type emitter 101 and forming the front side conductive structure 107 (also known as the front side silver-aluminum electrode) in the form of a conductive metal contact; and the back side metallization paste 106 etches and fires through the surface of the back side passivation film 104 in contact with the back side metallization paste 106, thereby forming an electrical contact with the back surface field 102 and forming the back side conductive structure 108 (also known as the back side silver electrode) in the form of a conductive metal contact, and thus, obtaining an n-PERT solar cell.

The serial numbers of the above steps are not regarded as the limitation on the sequence of the respective steps.

During the firing process in Step (5), the degree to which the silver-aluminum paste is converted into a molten state and fires through the passivation film depends on the composition and thickness of the passivation film, the composition of the silver-aluminum paste itself, and the firing conditions. The firing temperature can be in the range of 700 to 850 degrees Celsius, such as 710° C., 720° C., 750° C., 780° C., 800° °C., 815° C., 820° C., and 835° C. The firing time alone can be performed in the range of 1 second to 5 minutes, for example, can be in a second scale, such as in the range of 1 second to 5 seconds, or can be in a minute scale, such as in the range of 1 minute to 2 minutes. If the sintering time is too short, it is difficult for the silver-aluminum paste to fire through the passivation film. If the firing time is too long, the silver-aluminum paste will corrode other structures after firing through the passivation film, thereby damaging the photovoltaic device. Therefore, the silver-aluminum paste needs to corrode or etch the passivation film at a controllable rate during firing. Firing causes the organic medium of the silver-aluminum paste to be burnout, and the aluminum powder in the silver-aluminum paste melts and flows to the p-type semiconductor interface, where it reacts with the p-type semiconductor and promotes the formation of low-resistance electrical contact. The etching process cannot be lasted too long, otherwise it will corrode the p-type semiconductor, thereby damaging the internal structure of the photovoltaic device. The entire firing process includes a single firing process, but the entire firing process also includes a process from a low temperature to a high temperature and cooling, so it will exceed 10 seconds.

Figure 2:
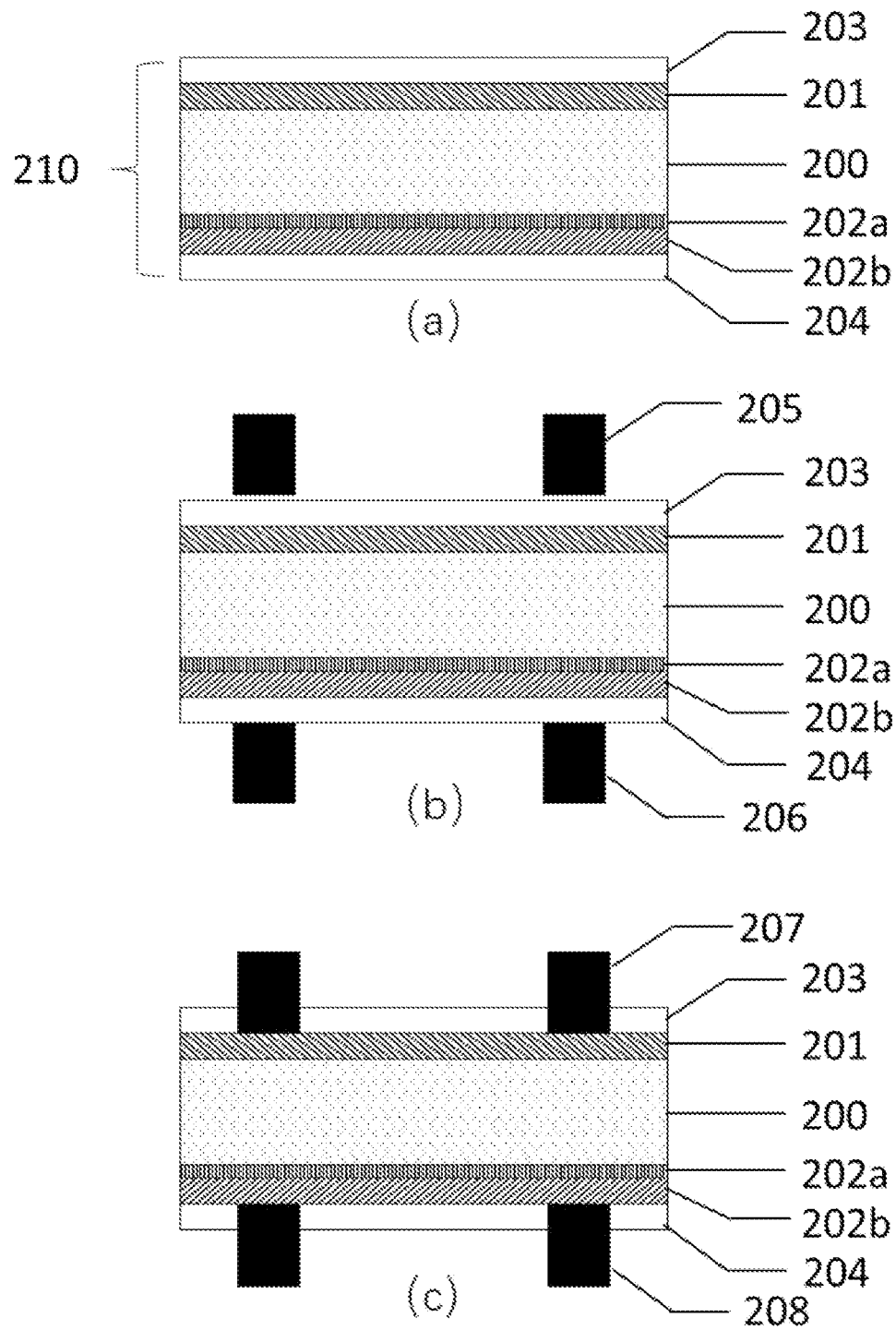
FIG. 2 is a sectional view of an n-type tunnel oxide passivated contact (n-TOPCon) solar cell prepared by applying the conductive paste composition in some embodiments of the present disclosure.

The Second Photovoltaic Device:

As shown in FIG. 2, some embodiments of the present disclosure provide a second photovoltaic device, which is a tunnel oxide passivated contact (n-TOPCon) solar cell, which utilizes the first conductive paste composition during preparation.

As shown in FIG. 2c, the n-TOPCon solar cell includes structures of:
(1) the n-type crystalline silicon substrate 200, located in the middle of the n-TOPCon solar cell;
(2) the front side p-type emitter 201, located on the front side of the n-type crystalline silicon substrate 200;
(3) the front side passivation film 203, deposited on the surface of the front side p-type emitter 201;
(4) the tunneling passivation film 202a, located on the back side of the n-type crystalline silicon substrate 200;
(5) the $n^+$ polysilicon layer 202b, located on the surface of the tunneling passivation film 202a;
(6) the back side passivation film 204, deposited on the surface of the $n^+$ polysilicon layer 202b;
(7) the front side conductive structure 207, which fires through at least a portion of the front side passivation film 203 on the surface of the front side p-type emitter 201 and forms an electrical contact with the front side p-type emitter 201;
(8) the back side conductive structure 208, which fires through at least a portion of the back side passivation film 204 on the surface of the $n^+$ polysilicon layer 202b and forms an electrical contact with the $n^+$ polysilicon layer 202b.

The above serial numbers do not indicate the relative positional relationship between the respective structures. The section of the n-TOPCon solar cell same as that of the n-PERT solar cell refers to the description about the n-TOPCon solar cell, and the details are not repeated here.

Wherein, the n-type crystalline silicon substrate 200 (also known as the n-type lightly doped substrate), the front side p-type emitter 201 (also known as the p-type semiconductor), the tunneling passivation film 202a, the $n^+$ polysilicon layer 202b, the front side passivation film 203 and the back side passivation film 204 are collectively referred to as the semiconductor substrate 210 (also known as the n-type semiconductor substrate).

In the n-TOPCon solar cell, the tunneling passivation film 202a and the n⁺ polysilicon layer 202b are formed by a tunneling passivation contact method.

The front side conductive structure 207 is formed using the first conductive paste composition. The first conductive paste composition (e.g., the front side silver-aluminum paste 205) is applied onto at least a portion of the surface of the front side passivation film 203 in a desired patterned form, and the first conductive paste composition etches and fires through the surface of the front side passivation film 203 in contact with the first conductive paste composition during the subsequent firing, thereby forming an electrical contact with the front side p-type emitter 201, so as to form the front side conductive structure 207 (also known as a front side silver-aluminum electrode) in the form of a conductive metal contact.

The back side conductive structure 208 can utilize a metallization silver paste (such as a silver paste containing a Pb—Te—O glass powder) used in the p-type crystalline silicon cell on the market. The conductive paste composition (e.g., the back side metallization paste 206) is applied onto at least a portion of the surface of the back side passivation film 204 in a desired patterned form, and the conductive paste composition etches and fires through the surface of the back side passivation film 204 in contact with the first conductive paste composition during the subsequent firing, thereby forming an electrical contact with the n⁺ polysilicon layer 202b, so as to form the back side conductive structure 208 (also known as a back side silver electrode) in the form of a conductive metal contact.

As shown in FIGS. 2a to 2c, the preparation method for the above n-TOPCon solar cell comprises steps of:

(1) providing the n-type crystalline silicon substrate 200, wherein the n-type crystalline silicon substrate 200 is formed by lightly doped diffusion on the crystalline silicon wafer using a phosphorus source;

(2) doping the front side of the n-type crystalline silicon substrate 200 with a trivalent element (e.g., boron or gallium) by a diffusion method, so as to form the front side p-type emitter 201 on the front side of the n-type crystalline silicon substrate 200; forming the tunneling passivation film 202a and the n⁺ polysilicon layer 202b (n⁺ poly-Si) by a tunneling passivation contact method using a tunnel oxide (e.g., $SiO_2$) on the n-type crystalline silicon substrate 200;

(3) depositing the front side passivation film 203 on the surface of the front side p-type emitter 201, and depositing the back side passivation film 204 on the n⁺ polysilicon layer 202b;

(4) applying the first conductive paste composition as the front side silver-aluminum paste 205 onto at least a portion of the surface of the front side passivation film 203 in a patterned form, and applying a metallization silver paste for the p-type crystalline silicon cell on the market, such as a silver paste containing a Pb—Te—O glass powder, as the back side metallization paste 206 onto at least a portion of the surface of the back side passivation film 204 in a patterned form;

(5) firing is performed so that the front side silver-aluminum paste 205 etches and fires through the surface of the front side passivation film 203 in contact with the front side silver-aluminum paste 205, thereby forming an electrical contact with the front side p-type emitter 201 and forming the front side silver-aluminum electrode in the form of a conductive metal contact; and the back side metallization paste 206 etches and fires through the surface of the back side passivation film 204 in contact with the back side metallization paste 206, thereby forming an electrical contact with the n⁺ polysilicon layer 202b and forming the back side electrode in the form of a conductive metal contact, and thus, obtaining an n-TOP Con solar cell.

The serial numbers of the above steps are not regarded as the limitation on the sequence of the steps.

[A Second Conductive Paste Composition]

The present disclosure also provides a second conductive paste composition that can also form a low-resistance electrical contact with the p-type semiconductor of the photovoltaic device. Bismuth oxide instead of lead oxide is used in the second conductive paste composition, so the toxicity of the second conductive paste composition is further reduced compared with that of the first conductive paste composition. The section of the above description of the second conductive paste composition same as that of the first conductive paste composition are incorporated by reference into this section. Preferably, the second conductive paste composition of the present disclosure and the bismuth-boron-selenium glass frit contained therein do not contain any form of tellurium (Te), such as tellurium oxide ($TeO_2$). The second conductive paste composition will be specifically described below.

The second conductive paste composition provided by some embodiments of the present disclosure includes the following components:

(1) a bismuth-boron-selenium glass frit;
(2) a conductive component;
(3) an aluminum elemental component;
(4) an organic medium.

Wherein, the bismuth-boron-selenium glass frit, the conductive component, and the aluminum elemental component are used as a solid component in the conductive paste composition, and the sum of the percentages by weight is 100%. The organic medium acts as a dispensed phase in the conductive paste composition and provides a printing property.

Bismuth-Boron-Selenium Glass Frit:

In some embodiments, the bismuth-boron-selenium glass frit is a composition with a glass component, which can account for 0.5% to 10% of the total solid in the conductive paste composition. In some other embodiments, the ratio of the bismuth-boron-selenium glass frit also ranges from 0.8% to 9.8%, 1% to 9.5%, or 1.5% to 9%, and further ranges from 2% to 8%, 3% to 7%, 4% to 6%, or 5% to 5.5%. The percentage of each component in the conductive paste composition is expressed in a percentage by weight (wt %). The adjustment of the ratio of the bismuth-boron-selenium glass frit in the total solid of the conductive paste composition needs to be ensured that the sum of the percentages by weight of each component in the conductive paste composition is 100%.

In some embodiments, the bismuth-boron-selenium glass frit at least contains the following components: 50% to 90% of $Bi_2O_3$, 2% to 35% of $B_2O_3$, and 0.1% to 15% of $SeO_2$. The percentage of each component in the glass frit is expressed in a percentage by weight (wt %), which is calculated based on the total weight of the dry weight of the bismuth-boron-selenium glass frit. The adjustment of the ratio of each component in the bismuth-boron-selenium glass frit needs to be ensured that the sum of the ratios of each component is 100%.

In some embodiments, based on the total weight of the dry weight of the bismuth-boron-selenium glass frit, the content (wt %) of $Bi_2O_3$ in the bismuth-boron-selenium glass frit ranges from 52% to 90%, 55% to 88%, 58% to 85%, 60% to 80%, 66.6% to 75%, or 68.9% to 71.3%, and further ranges from 70% to 71%. $Bi_2O_3$ can play the role of PbO in the glass frit, change its thermal properties, reduce its melting temperature and improve its fluidity, and its toxicity is lower. Thus, $Bi_2O_3$ can be used to replace PbO to further reduce the toxicity of the glass frit, but $Bi_2O_3$ is not replaced by a ratio of 1:1, but needs to be selected according to specific conditions.

In some embodiments, based on the total weight of the dry weight of the bismuth-boron-selenium glass frit, the content (wt %) of $B_2O_3$ in the bismuth-boron-selenium glass frit ranges from 2% to 20%, 3% to 18%, 5% to 16%, 7% to 15%, 10.5% to 12%, 10.9% to 11.6%, or 11.1% to 11.3%. The adjustment of the content needs to be ensured that the sum of the content of each component of the bismuth-boron-selenium glass frit is 100%.

In some embodiments, based on the total weight of the dry weight of the bismuth-boron-selenium glass frit, the content (wt %) of $SeO_2$ in the bismuth-boron-selenium glass frit ranges from 0.1% to 15%, 0.2% to 14%, 1% to 13%, 2% to 12.4%, 3.1% to 9.3%, or 3.5% to 6.2%.

In some embodiments, in addition to the above three basic components, the bismuth-boron-selenium glass frit can also contain additives. The additives can be selected from oxides of any one of alkali metal elements, alkaline earth metal elements, transition metal elements, or a mixture of oxides of several elements. For example, the additives can be selected from any one or more of the group consisting of $SiO_2$, $BiF_3$, $AgO_2$, $Ag_2O$, $AgO$, $ZnO$, $MgO$, $CaO$, $Al_2O_3$, $Li_2O$, $Na_2O$, $K_2O$, $Rb_2O$, $Ce_2O$, and $Fe_2O_3$. "More" includes any two components, any three components, any four components, etc., or all components. The content of each component in the additives can be adjusted accordingly depending on the desired glass property.

In some embodiments, based on the total weight of the dry weight of the bismuth-boron-selenium glass frit, a total content of the additives ranges from 0.1% to 25%, 2% to 20%, 5% to 15%, 8% to 12%, or 10.5% to 11.7%, or further ranges from 10.9% to 11.2%.

In some embodiments, if the additives contain $Li_2O$, based on the total weight of the dry weight of the bismuth-boron-selenium glass frit, the content of $Li_2O$ ranges from 0.1% to 5%, 0.2% to 4.5%, 0.5% to 4%, 0.7% to 3.5%, 1% to 3%, 1.5% to 2.5%, or 2% to 2.2%. The percentage of each component in the glass frit is a percentage by weight (wt %).

In other embodiments, if the additives contain $Na_2O$, based on the total weight of the dry weight of the bismuth-boron-selenium glass frit, the content of $Na_2O$ ranges from 0.1% to 5%, 0.2% to 4.7%, or 0.3% to 4.5%, and further ranges from 0.5% to 4%, 0.7% to 3.5%, 1% to 3%, 1.5% to 2.5%, or 2% to 2.2%. $Li_2O$ and $Na_2O$ are alkali metal oxides with a low melting point, which can reduce the melting temperature of the glass frit and improve the fluidity, so they can be used as the components of the additives. The adjustment of the content needs to be ensured that the sum of the content of each component of the bismuth-boron-selenium glass frit is 100 wt %.

In some other embodiments, if the additives contain $ZnO$, based on the total weight of the dry weight of the bismuth-boron-selenium glass frit, the content of $ZnO$ ranges from 0.1% to 20%, 0.5% to 19%, or 0.8% to 15%, and further ranges from 1% to 12%, 2% to 10%, 3% to 8%, 5% to 9%, or 6% to 8%. $ZnO$ is a transition metal oxide, which can be used as a glass modifier to change the original thermal properties of the glass, so it can also be used as the component of the additives. The rest of the components of the additives are the same.

It should be ensured that various components (including basic components and additives) of the glass frit are not reactive to the silver-aluminum paste in the conductive paste composition. More specifically, it is ensured that each component in the glass frit does not react prematurely with the aluminum powder in the silver-aluminum paste, otherwise it will affect the electrical conductivity and the efficiency of the resulting photovoltaic device. Inventors of the present disclosure surprisingly found in the research that $SeO_2$ added to the bismuth-boron-selenium glass frit can reduce the Tg point of the glass frit without excessively oxidizing the aluminum powder in the silver-aluminum paste, which enables the photovoltaic device such as a solar cell to form a low-resistance electrical contact. Therefore, some embodiments of the present disclosure creatively propose a bismuth-boron-selenium glass frit to replace the current lead-silicon-boron glass frit, and the bismuth-boron-selenium glass frit is less toxic than the lead-boron-selenium glass frit mentioned above, which can meet the requirement for a low toxicity photovoltaic device.

In embodiments, bismuth-boron-selenium oxide in some the bismuth-boron-selenium glass frit can be completely amorphous, or can be partly amorphous and partly crystalline as produced from the molten state during firing. The content of the crystallized bismuth-boron-selenium oxide in the bismuth-boron-selenium glass frit accounts for less than 1.5% or accounts for 1% or less than 1% of the total weight of bismuth-boron-selenium oxide, so as to facilitate the subsequent screen printing and etching process.

In some embodiments, the preparation method for the bismuth-boron-selenium glass frit comprises steps of: proportioning the above oxide according to the required amount, and then firing at high temperature to bring it to a molten state; after mixing the molten materials evenly, quenching molten materials rapidly, and then pulverizing the quenched material to form a bismuth-boron-selenium glass frit in a powder form. The particle size of the bismuth-boron-selenium glass frit powder should not be too large, otherwise it is not suitable for mixing evenly during the preparation of the conductive paste, so the $D_{50}$ of the bismuth-boron-selenium glass frit powder can range from 0.5 to 3.0 μm.

Conductive Component:

In some embodiments, the conductive component is used to conduct current after the photovoltaic device is formed. The conductive component can be selected from a mixture of any one or more of silver element, silver alloy and silver salt. The silver salt can be selected from $AgCl$, $AgNO_3$, $AgOOCH_3$ (silver acetate), silver trifluoroacetate or silver orthophosphate ($Ag_3PO_4$).

In some embodiments, the conductive component can exist in a form of such as flakes, granules, colloids. If a granular form is presented, the particle size of the conductive component should not be too large, otherwise the dispersibility will be affected. In some embodiments, the average particle size of the conductive component can be in a range of a micron scale, for example, it is ≤15 μm, ≤10 μm, ≤5 μm, or ≤2 μm, or it ranges from 0.1 μm to 1 μm. In other embodiments, the average particle size of the conductive component can be in a range of a nanoscale, for example, it is ≤800 nm, ≤700 nm, ≤500 nm, ≤300 nm, ≤200 nm, or ≤50 nm, or it ranges from 10 nm to 20 nm.

In some other embodiments, the percentage by weight of the conductive component in the total solid of the conductive paste composition ranges from 87% to 99%, 88% to 98%, 90% to 97%, 91% to 96%, or 92% to 95%, or it further ranges from 93% to 94%. The adjustment of the ratio of the conductive component of the total solid in the conductive paste composition needs to be ensured that the sum of the percentages by weight of each component in the conductive paste composition is 100%.
Aluminum Elemental Component:

In some embodiments, the aluminum element is a necessary component in the conductive paste composition. The aluminum elemental component can be an aluminum powder. The aluminum elemental component and the conductive component are dispersed in the organic medium, and during a high temperature firing process, the aluminum powder can assist in forming a low-resistance ohmic contact. As such, if the conductive component is silver element, the conductive paste composition contains a silver-aluminum paste (Ag/Al paste).

The inventors found in the research that the oxide components in the first conductive paste composition and the second conductive paste composition in each embodiment of the present disclosure do not excessively oxidize the aluminum powder, and also have a lower melting temperature and a decent fluidity, which can meet the requirement for screen printing and etching the passivation film, and aluminum element can also form a low-resistance electrical contact with the p-type emitter, so that a better photovoltaic device efficiency is provided.

In the second conductive paste composition, the aluminum elemental component can account for 0.5% to 3%, 0.8% to 2.9%, 0.9% % to 2.8%, or 1.0% to 2.5% of the total solid in the second conductive paste composition, or can further account for 1.2% to 2.4%, 1.5% to 2.1%, or 1.6% to 2.0% of the total solid in the second conductive paste composition. The adjustment of the ratio of the aluminum elemental component of the total solid in the conductive paste composition needs to be ensured that the sum of the percentages by weight of each component in the conductive paste composition is 100%.

In some embodiments, the aluminum elemental component can be mixed with other components of the conductive paste composition in a powder form. The average particle size of the aluminum elemental component can be in a micron scale. As a micron-scale aluminum elemental component, the particle size of the aluminum elemental component is ≤5 µm, ≤4 µm, ≤3 µm, or ≤2 µm, or ranges from 1 µm to 5 µm.
Organic Medium:

In some embodiments, with respect to the solid composed of the conductive component, the bismuth-boron-selenium glass frit and the aluminum elemental component, the organic medium is used as a liquid phase in the conductive paste composition to dispense the above conductive component, the bismuth-boron-selenium glass frit and the aluminum elemental component to form a paste with a certain viscosity. During the high temperature firing process after screen printing, the organic medium may be burnout.

In some embodiments, the organic medium can include polymers and organic solvents. The polymers can include celluloses, resins, esters, etc. The organic solvents can include α-terpene, β-terpene, dibutyl phthalate, diethylene glycol monobutyl ether, diethylene glycol butylether acetate, hexanediol, etc. The celluloses include ethyl celluloses, ethyl hydroxyethyl celluloses, or mixtures thereof. The resins include wood rosin or phenolic resins, or mixtures thereof. The esters include lower alcohols such as polymethacrylate.

In some embodiments, the content of the organic medium in the n-type conductive paste composition depends on the required viscosity, rheological property and physical property of the n-type conductive paste composition as a whole. The content of the organic medium can account for 10% to 40%, 12% to 38%, or 15% to 35% of the total weight of the conductive paste composition, or can further account for 20% to 30%. The percentage is a percentage by weight.

The conductive paste composition (the n-type conductive paste composition) in some embodiments of the present disclosure includes a bismuth-boron-selenium glass frit (Bi—B—Se oxide), a silver powder, an aluminum powder, and an organic medium. The bismuth-boron-selenium glass frit contains oxides of bismuth, boron and selenium, and is used to etch or corrode the passivation film during firing at a high temperature. The organic medium belongs to a dispensed phase and is used to dispense the above bismuth-boron-selenium glass frit, silver powder and aluminum powder. The conductive paste composition in some embodiments of the present disclosure is capable of etching and firing through the passivation film of the photovoltaic device and forming a low-resistance contact with the p-type semiconductor after firing. This is an effect that is difficult to achieve by current conductive pastes without aluminum. One of the reasons is that it is difficult for conductive pastes without aluminum powder to form a low-resistance electrical contact with the p-type semiconductor after firing though the passivation film of the photovoltaic device, which ultimately affect the efficiency of the photovoltaic device.

Second, the inventors also found that selenium oxide is beneficial for lowering the softening point and the melting temperature of the conductive paste, and improving the fluidity.

In addition, the n-type conductive paste composition in some embodiments of the present disclosure does not contain highly toxic elements like thallium, chromium and lead, so that the overall conductive paste can be controlled within the range of weak toxicity.

Therefore, the bismuth-boron-selenium glass frit (containing Bi—B—Se oxide) in some embodiments of the present disclosure can be used as an alternative for the known lead-boron-selenium glass frit (containing Pb—Si—B oxide) and used with silver-aluminum paste to prepare an n-type conductive paste composition, which can fire through the passivation film and form a decent electrical contact with the p-type semiconductor under the passivation film during the preparation of the photovoltaic device.
Preparation Method for the Second Conductive Paste Composition:

Some embodiments of the present disclosure also provide a preparation method for the second conductive paste composition, comprising steps of:

Mixing the conductive component, the bismuth-boron-selenium glass frit and the aluminum elemental component according to the above proportion, dispensing them into a certain amount of the organic medium, and forming the above second conductive paste composition after even dispension. The adjustment of the ratio of the bismuth-boron-selenium glass frit, the conductive component and the aluminum elemental component should be ensured that the sum of the percentages by weight of the three components of the total solid in the conductive paste composition is 100%.
Use of the Second Conductive Paste Composition:

The conductive paste composition in some embodiments of the present disclosure can be used for preparing a photovoltaic device, such as a solar cell. For example, the conductive paste composition rapidly etches the passivation film of the photovoltaic device during the firing process, and finally fires though the passivation film to form a low-resistance electrical contact with the p-type semiconductor of the photovoltaic device. The p-type semiconductor can preferably be a p-type emitter, made from a silicon substrate.

Some embodiments of the present disclosure provide a third photovoltaic device, which is an n-PERT solar cell (passivated emitter, rear totally diffused), which utilizes the second conductive paste composition during preparation. Apart from this, the rest of the structure, materials and preparation method are same as the first photovoltaic device. The description of the first photovoltaic device in the present disclosure can be incorporated by reference into this section.

Some embodiments of the present disclosure provide a forth photovoltaic device, which is a tunnel oxide passivated contact (n-TOPCon) solar cell, which utilizes the second conductive paste composition during preparation. Apart from this, the rest of the structure, materials and preparation method are same as the first photovoltaic device. The description of the second photovoltaic device in the present disclosure can be incorporated by reference into this section.

The technical solutions of the present disclosure will be further described below with reference to the specific embodiments.

Examples 1 to 5: Regarding the Lead-Boron-Selenium Glass Frit

The content of each component of the lead-boron-selenium glass frits of Examples 1 to 5 and the lead-boron glass frits of Comparative Examples 1 to 6 are shown in Table 1 and Table 2. Wherein, each numerical value in the table is a percentage by weight (wt %). For example, 74.5 in Example 1 indicates that PbO in this example accounts for 74.5 wt % of the total weight of the lead-boron-selenium glass frit of Example 1. The rest of the components are the same. The quality inspection data of the n-PERT solar cells made from the lead-boron-selenium glass frits of Examples 1 to 5 and made from the lead-boron glass frits of Comparative Examples 1 to 6 are shown in Table 3.

TABLE 1

Composition ratio table of the lead-boron-selenium glass frits of Examples 1 to 5

| wt % | Example 1 | Example 2 | Example 3 | Example 4 | Example 5 |
|---|---|---|---|---|---|
| PbO | 74.5 | 73.1 | 71.7 | 68.8 | 65.9 |
| $Li_2O$ | 1.1 | 1.0 | 1.0 | 1.0 | 0.9 |
| $Na_2O$ | 0.2 | 0.2 | 0.2 | 0.2 | 0.2 |
| $B_2O_3$ | 7.6 | 7.5 | 7.3 | 7.1 | 6.7 |
| $SiO_2$ | 2.0 | 2.0 | 1.9 | 1.8 | 1.8 |
| $Bi_2O_3$ | 0.3 | 0.3 | 0.3 | 0.3 | 0.3 |
| $Al_2O_3$ | 0.4 | 0.4 | 0.4 | 0.4 | 0.4 |
| $K_2O$ | 0.1 | 0.1 | 0.1 | 0.1 | 0.1 |
| ZnO | 11.9 | 11.7 | 11.5 | 11.0 | 10.6 |
| $SeO_2$ | 1.9 | 3.7 | 5.6 | 9.3 | 13.1 |
| $TeO_2$ | 0 | 0 | 0 | 0 | 0 |
| Total | 100.0 | 100.0 | 100.0 | 100.0 | 100.0 |
| Tg | 299 | 293 | 295 | 295 | 293 |

TABLE 2

Composition ratio table of the lead-boron-selenium glass frits of Comparative Examples 1 to 6

| wt % | Comparative Example 1 | Comparative Example 2 | Comparative Example 3 | Comparative Example 4 | Comparative Example 5 | Comparative Example 6 |
|---|---|---|---|---|---|---|
| PbO | 75.9 | 75.4 | 74.9 | 73.9 | 71.9 | 69.9 |
| $Li_2O$ | 1.1 | 1.1 | 1.1 | 1.0 | 1.0 | 1.0 |
| $Na_2O$ | 0.2 | 0.2 | 0.2 | 0.2 | 0.2 | 0.2 |
| $B_2O_3$ | 7.8 | 7.7 | 7.7 | 7.6 | 7.4 | 7.2 |
| $SiO_2$ | 2.0 | 2.0 | 2.0 | 2.0 | 1.9 | 1.9 |
| $Bi_2O_3$ | 0.3 | 0.3 | 0.3 | 0.3 | 0.3 | 0.3 |
| $Al_2O_3$ | 0.4 | 0.4 | 0.4 | 0.4 | 0.4 | 0.4 |
| $K_2O$ | 0.1 | 0.1 | 0.1 | 0.1 | 0.1 | 0.1 |
| ZnO | 12.2 | 12.1 | 12.0 | 11.8 | 11.5 | 11.2 |
| $SeO_2$ | 0 | 0 | 0 | 0 | 0 | 0 |
| $TeO_2$ | 0 | 0.7 | 1.3 | 2.7 | 5.3 | 7.8 |
| Total | 100.0 | 100.0 | 100.0 | 100.0 | 100.0 | 100.0 |
| Tg | 317 | 309 | 306 | 307 | 313 | 315 |

The lead-boron-selenium glass frit of each example and the glass frit of each comparative example were used to prepare the conductive paste compositions, and the n-type solar cells were prepared using the conductive paste compositions. The pastes used for the front sides of the two n-type solar cells in the above embodiments may be the same. Wherein, the conductive paste composition contains 4.38% of the lead-boron-selenium glass frit, 94.52% of the conductive component (silver powder) and 1.1% of the aluminum elemental component (aluminum powder). In some other embodiments, the content of the three components may not be limited to the above values.

TABLE 3

Quality inspection data sheet for the n-type solar cells

|  | Tg point (° C.) | Series resistance (Ω) | Efficiency (%) | Fill factor (%) |
|---|---|---|---|---|
| Example 1 | 299 | 4.53 | 21.42 | 77.37 |
| Example 2 | 293 | 5.19 | 21.21 | 77.59 |
| Example 3 | 295 | 4.71 | 21.38 | 77.29 |
| Example 4 | 295 | 4.44 | 21.52 | 77.62 |
| Example 5 | 293 | 4.72 | 21.38 | 77.17 |
| Comparative Example 1 | 317 | 5.17 | 21.27 | 76.83 |
| Comparative Example 2 | 309 | 11.3 | 19.03 | 68.93 |
| Comparative Example 3 | 306 | 45.7 | 8.83 | 34.77 |
| Comparative Example 4 | 307 | 283.7 | 4.42 | 27.1 |
| Comparative Example 5 | 313 | 129.4 | 2.22 | 26.4 |
| Comparative Example 6 | 315 | 145.4 | 1.34 | 21.97 |

In the above table, the series resistance $R_s$ includes the resistance $r_{mf}$ of the metal grid line as the front side electrode, the contact resistance $r_{c1}$ between the metal grid line and the front surface, the resistance $r_t$ of the front surface diffusion layer, the base resistance $r_b$, the contact resistance $r_{c2}$ between the lower electrode and the semiconductor silicon, the resistance $r_{mb}$ of the upper electrode metal grid line. That is $$R_s = r_{mf} + r_{c1} + r_t + r_b + r_{c2} + r_{mb}.$$

The conversion efficiency η refers to the percentage of the maximum power of the solar cell when it is illuminated to the total radiant power $P_{total}$ incident on the solar cell, i.e., $\eta = I_{sc}U_{oc}FF/P_{total} = U_{mp}I_{mp}/(A_rP_{in})$; $U_{mp}$ and $I_{mp}$ are the voltage and current corresponding to the maximum output power point, respectively; A, is the total area of the solar cell; $P_{in}$ is the power of incident light per unit area. In the actual test, the efficiency of the solar cell was tested with a Berger IV efficiency tester. The method of testing includes: making the xenon arc lamp in the efficiency tester to simulate sunlight an intensity of AM 1.5 and making it illuminate the front side of the solar cell. The multi-point contact method is used to measure the current value and the voltage value of each point of the solar cell to generate the current-voltage curve of the solar cell and to calculate the efficiency of the solar cell according to the current-voltage curve.

The fill factor (FF) is the ratio of the maximum power of the solar cell to the "product of the open circuit voltage and the short circuit current", i.e., $FF = I_{mp}U_{mp}/(I_{sc}U_{oc})$; wherein, $I_{sc}U_{oc}$ is the limit output power of the solar cell; $I_{mp}U_{mp}$ is the maximum output power of the solar cell.

The preparation method for the lead-boron-selenium glass frits of above examples and comparative examples comprises steps of: mixing the components according to the proportions shown in Table 1 and Table 2, and then conducting a heat treatment in a crucible or furnace at a temperature of 900° ° C. to 1200° C. When each component reaches a completely molten state, the heat treatment is continued for 30 minutes, and then quenching, grounding and sieving to obtain a powder with a $D_{50}$ of 1.0 to 3.0 μm, that is, the lead-boron-selenium glass frit.

In the lead-boron-selenium glass frits of Examples 1 to 5 and the lead-boron-selenium glass frits of Comparative Examples 1 to 6, $B_2O_3$, $SiO_2$, $Al_2O_3$ are used to form a glass network system; $SeO_2$, $TeO_2$, $Li_2O$, $K_2O$, $Na_2O$ with a low melting point are used to reduce the Tg point (glass transition temperature) of the entire glass system; PbO, $Bi_2O_3$ and ZnO are used as glass modifiers to modify the glass system, and they also have a certain corrosiveness, and are used to etch and fire through passivation film of the photovoltaic device during firing, so as to form an electrical contact the p-type semiconductor of the photovoltaic device.

$TeO_2$ was added to the lead-boron-selenium glass frits of the comparative examples, while $SeO_2$ was added to the lead-boron-selenium glass frits of the examples. After testing the above comparative examples and examples, the inventors found that when the lead-boron-selenium glass frits of the comparative examples and examples is formulated into the n-type conductive paste composition containing the silver-aluminum paste, and applied onto the surface of the passivation film of the photovoltaic device, the $TeO_2$ in the conductive pastes of the comparative examples will oxidize the aluminum element in the conductive paste to alumina in the subsequent firing process, so that it cannot form a low-resistance electrical contact with the p-type semiconductor of the photovoltaic device, which may reduce the efficiency of the photovoltaic device.

As shown in the data of the Tg point in Table 3, the Tg point of each example is lower than that of each comparative example, indicating that the use of $SeO_2$ instead of $TeO_2$ can reduce the Tg point.

As shown in the series resistance data in Table 3, when the content of $TeO_2$ exceeds 1.3 wt %, the contact resistance increases significantly, indicating that with the gradual increase of the content of $TeO_2$, the degree of oxidation of the aluminum element increases, so the contact resistance increases drastically and as the contact resistance increases, the fill factor and the efficiency of the photovoltaic device becomes worse.

Table 3 shows the phenomenon that the efficiency of the photovoltaic device reduces rapidly with increasing amount of added $TeO_2$. It can be seen from the data of Comparative Example 3 that when the content of $TeO_2$ is 1.3 wt %, the efficiency of the photovoltaic cell drops to 8.83%, which can no longer meet the efficiency requirement for the photovoltaic device in normal use. It can be seen from the data of Comparative Examples 4 to 6 that with the further increase of the content of $TeO_2$, the efficiency of the photovoltaic cell drops even further to less than 5%. This indicates that even a small amount of $TeO_2$ will oxidize the aluminum element in the silver-aluminum paste, which has a great impact on the efficiency of the photovoltaic device.

In addition, Table 3 also shows that the efficiency of the photovoltaic device remains basically unchanged with increasing amount of added $SeO_2$. it can be seen from the data of Example 1 to Example 5 in Table 3 that even if the content of $SeO_2$ in the glass frit is increased from 1.9% to 13.1%, the efficiency of the photovoltaic device will remain greater than 21%, which can meet the efficiency requirement for photovoltaic device in commercial applications. This indicates that even if the addition of $SeO_2$ is much higher than that of $TeO_2$, it will basically not oxidize the aluminum element in the silver-aluminum paste, so it will not affect the contact resistance to the p-type semiconductor of the photovoltaic device, and thus will not affect the efficiency of the photovoltaic device.

Examples 6 to 9: Regarding the Bismuth-Boron-Selenium Glass Frit

Compared with Examples 1 to 5, the bismuth-boron-selenium glass frits provided in these examples uses bismuth oxide instead of lead oxide. In order to keep the efficiency of the photovoltaic device basically unchanged, bismuth oxide and lead oxide are not equivalent replacements of 1:1, but need to be adjusted according to specific conditions. The weight percent of the components for each composition are shown in Table 4.

TABLE 4

Composition ratio table of the bismuth-boron-selenium glass frits of Comparative Example 7 and Examples 6 to 9

| wt % | Comparative Example 7 | Example 6 | Example 7 | Example 8 | Example 9 |
|---|---|---|---|---|---|
| $Bi_2O_3$ | 76.0 | 73.6 | 71.3 | 68.9 | 66.6 |
| $Li_2O$ | 1.95 | 1.9 | 1.8 | 1.8 | 1.7 |
| $Na_2O$ | 0.15 | 0.15 | 0.15 | 0.1 | 0.1 |
| $B_2O_3$ | 12.0 | 11.65 | 11.3 | 10.9 | 10.5 |
| ZnO | 9.1 | 8.8 | 8.55 | 8.3 | 8.0 |
| $Al_2O_3$ | 0.2 | 0.2 | 0.2 | 0.2 | 0.2 |
| $SiO_2$ | 0.6 | 0.6 | 0.5 | 0.5 | 0.5 |
| $SeO_2$ | 0.0 | 3.1 | 6.2 | 9.3 | 12.4 |
| Total | 100.0 | 100.0 | 100.0 | 100.0 | 100.0 |

The bismuth-boron-selenium glass frit of each example and the glass frit of each comparative example were used to prepare the conductive paste compositions, and the n-type solar cells were prepared using the resulting conductive paste compositions. The front side pastes of the two n-type solar cells mentioned in the above examples can be the same. Wherein, the conductive paste composition contains 4.38% of the bismuth-boron-selenium glass frit, 94.52% of the conductive component (silver powder), and 1.1% % of the aluminum elemental components (aluminum powder) based on the sum of the solid content in the conductive paste composition as 100 wt %.

TABLE 5

Quality inspection data sheet for the n-type solar cells

| | Tg point (° C.) | Series resistance (Ω) | Efficiency (η) | Fill factor (FF) |
|---|---|---|---|---|
| Comparative Example 7 | 365 | 5.21 | 21.4 | 76.76 |
| Example 6 | 367 | 4.34 | 21.69 | 77.85 |
| Example 7 | 368 | 4.63 | 21.59 | 77.53 |
| Example 8 | 369 | 5.87 | 21.16 | 75.93 |
| Example 9 | 368 | 6.1 | 21.07 | 75.6 |

In Table 4, $Bi_2O_3$ was used to replace PbO, but the contents of $B_2O_3$ and $Li_2O$ were increased, and the contents of $Al_2O_3$ and ZnO were decreased. Although $K_2O$ is not added in Table 3, $K_2O$ can also be added as an alkali metal oxide in other examples. Comparative Example 7 shows that $SeO_2$ is not added, and Examples 6 to 9 show that $SeO_2$ is added in an increasing amount. Table 5 shows that the efficiency of the photovoltaic device has obvious advantages with the increase of the addition of $SeO_2$. It can be seen from Table 5 that the above bismuth-boron-selenium glass frit, with the content of $SeO_2$ in the glass frit increased from 3.1 wt % to 12.4 wt % is used to prepare the silver-aluminum conductive paste composition. After the conductive paste composition is formed on the surface of the passivation film of the photovoltaic device and during firing, the efficiency of the photovoltaic device was basically maintained between 21% and 22%. This indicates that in the lead-free glass frit system, even if the addition amount of $SeO_2$ reaches 12 wt %, it will not oxidize the aluminum element in the silver-aluminum paste, so it will not affect the resistivity between the aluminum element and the p-type semiconductor of the photovoltaic device, and thus will not affect the efficiency of the photovoltaic device. The method for testing the efficiency of the photovoltaic device in this embodiment is same as that in the first embodiment.

In addition, due to the limitation of the efficiency of the solar cell itself, in the field of solar cells, if the difference in efficiency is 0.05% this difference is significant. It can be seen from Table 5 that the negative control group does not contain $SeO_2$, and the efficiency of the solar cell prepared by it is 21.4%. The glass frit of Example 6 contains 3% of $SeO_2$, and the efficiency of the solar cell prepared by it is 0.3%, much higher than that of the negative control group. The glass frit of Example 7 contains 6% of $SeO_2$, and the efficiency of the solar cell prepared by it is 0.2% higher than that of the negative control group. The above data show that after a small amount of $SeO_2$ was added to the glass frit, the comparison of the efficiency between the prepared solar cells and the control example without $SeO_2$ is significant. Also, even if the addition of $SeO_2$ is high, it will not greatly reduce the efficiency of the solar cells, and it can still maintain the efficiency of the solar cells between 21% and 22%.

It can be seen from the experimental data of Examples 1 to 9 that the series resistance, the efficiency, the fill factor of the solar cell made from the lead-boron-selenium glass frit and the bismuth-boron-selenium glass frit are not much different, indicating that the two glass frits can be substituted for each other when preparing solar cells. That is, the lead-boron-selenium glass frit and the bismuth-boron-selenium glass frit can be used to prepare both the n-PERT solar cell and the n-TOPCon solar cell.

The above embodiments illustrate that the inventors of the present disclosure have creatively invented the lead-boron-selenium glass frit and the bismuth-boron-selenium glass frit, and the two glass frits can be substituted for each other according to specific conditions. After the above glass frit is prepared into the n-type conductive paste composition containing the silver-aluminum paste, each component therein will not over-oxidize the aluminum element in the paste during firing, so it can be used to prepare the photovoltaic device with a low resistivity.

The present disclosure has been introduced in detail above, and the principles and implementations of the present disclosure have been described with specific examples herein. The descriptions of the above embodiments are only used to help understand the methods and core ideas of the present disclosure; those skilled in the art, according to the idea of the present disclosure, will have changes in the specific implementations and application scope. Given the above, the content of this specification should not be construed as a limitation to the present disclosure.

What is claimed is:

1. A conductive paste composition, comprising:
a lead-boron-selenium glass frit accounting for 0.5 wt % to 10 wt % of a total solid in the conductive paste composition; wherein based on a total weight of a dry weight of the lead-boron-selenium glass frit, the lead-boron-selenium glass frit at least contains lead-boron-selenium oxides with 51 wt % to 82 wt % of PbO, 4 wt % to 20 wt % of $B_2O_3$, and 1 wt % to 16 wt % of $SeO_2$; the lead-boron-selenium oxides contained in the lead-boron-selenium glass frit are completely amorphous; or a first part of the lead-boron-selenium oxides contained in the lead-boron-selenium glass frit is amorphous, and a second part of the lead-boron-selenium oxides is crystalline, a content of the second part in the lead-boron-selenium glass frit accounts for less than 1.5% of a total weight of lead-boron-selenium oxides;
a conductive component accounting for 87 wt % to 99 wt % of the total solid;
an aluminum elemental component accounting for 0.5 wt % to 3 wt % of the total solid; and
an organic medium.

2. The conductive paste composition according to claim 1, wherein based on the total weight of the dry weight of the lead-boron-selenium glass frit, the lead-boron-selenium glass frit further contains 0.1 wt % to 25 wt % of additives selected from any one or more of the group consisting of $PbF_2$, $SiO_2$, $Bi_2O_3$, $BiF_3$, $AgO_2$, $Ag_2O$, $AgO$, $ZnO$, $MgO$, $CaO$, $Al_2O_3$, $Li_2O$, $Na_2O$, $K_2O$, $Rb_2O$, $Ce_2O$, and $Fe_2O_3$.

3. The conductive paste composition according to claim 1, wherein based on the total weight of the dry weight of the lead-boron-selenium glass frit, a content of $SeO_2$ in the lead-boron-selenium glass frit ranges from 2 wt % to 10 wt %.

4. The conductive paste composition according to claim 1, wherein based on the total weight of the dry weight of the lead-boron-selenium glass frit, the lead-boron-selenium glass frit contains no more than 1.2 wt % of $TeO_2$, or does not contain any form of tellurium.

5. The conductive paste composition according to claim 1, wherein the conductive component is selected from a mixture of any one or more of silver element, silver alloy, and silver salt.

6. The conductive paste composition according to claim 1 in use of an n-type crystalline silicon solar cell, wherein the conductive paste composition etches and fires through the passivation film of the n-type crystalline silicon solar cell, and a conductive structure electrically contacting a p-type doped emitter of the n-type crystalline silicon solar cell is formed.

7. An n-type crystalline silicon solar cell electrode, comprising:
a semiconductor substrate having an n-type crystalline silicon substrate, a p-type doped emitter disposed on the surface of the n-type crystalline silicon substrate, and at least one passivation film deposited on the surface of the p-type doped emitter; and
a conductive structure that fires through at least a portion of the passivation film and forms an electrical contact with the p-type doped emitter, wherein the conductive structure is formed of the conductive paste composition according to claim 1.

8. The n-type crystalline silicon solar cell electrode according to claim 7, wherein the n-type crystalline silicon solar cell electrode is an n-PERT solar cell electrode or an n-TOPCon solar cell electrode.

9. A conductive paste composition, comprising:
a bismuth-boron-selenium glass frit accounting for 0.5 wt % to 10 wt % of a total solid in the conductive paste composition; wherein based on a total weight of a dry weight of the bismuth-boron-selenium glass frit, the bismuth-boron-selenium glass frit at least contains bismuth-boron-selenium oxides with 50 wt % to 90 wt % of $Bi_2O_3$, 2 wt % to 35 wt % of $B_2O_3$, and 0.1 wt % to 15 wt % of $SeO_2$; the bismuth-boron-selenium oxides contained in the bismuth-boron-selenium glass frit are completely amorphous; or a first part of the bismuth-boron-selenium oxides contained in the bismuth-boron-selenium glass frit is amorphous, and a second part of the bismuth-boron-selenium oxides is crystalline,
a content of the second part in the bismuth-boron-selenium glass frit accounts for less than 1.5% of a total weight of bismuth-boron-selenium oxides;
a conductive component accounting for 87 wt % to 99 wt % of the total solid;
an aluminum elemental component accounting for 0.5 wt % to 3 wt % of the total solid; and
an organic medium.

10. The conductive paste composition according to claim 9, wherein the conductive component is selected from a mixture of any one or more of silver element, silver alloy, and silver salt.

11. The conductive paste composition according to claim 9, wherein based on the total weight of the dry weight of the bismuth-boron-selenium glass frit, a content of $SeO_2$ in the bismuth-boron-selenium glass frit ranges from 2 wt % to 12 wt %.

12. The conductive paste composition according to claim 9, wherein based on the total weight of the dry weight of the bismuth-boron-selenium glass frit, a content of $Li_2O$ in the bismuth-boron-selenium glass frit ranges from 0.1 wt % to 5 wt %; and/or Based on the total weight of the dry weight of the bismuth-boron-selenium glass frit, a content of $Na_2O$ in the bismuth-boron-selenium glass frit ranges from 0.1 wt % to 5 wt %; and/or
based on the total weight of the dry weight of the bismuth-boron-selenium glass frit, a content of ZnO in the bismuth-boron-selenium glass frit ranges from 0.1 wt % to 20 wt %.

13. The conductive paste composition according to claim 12, wherein based on the total weight of the dry weight of the bismuth-boron-selenium glass frit, the bismuth-boron-selenium frit further contains 0.1 wt % to 25 wt % of additives selected from any one or more of the group consisting of $SiO_2$, $BiF_3$, $AgO_2$, $Ag_2O$, $AgO$, $ZnO$, $MgO$, $CaO$, $Al_2O_3$, $Li_2O$, $Na_2O$, $K_2O$, $Rb_2O$, $Ce_2O$, and $Fe_2O_3$.

14. The conductive paste composition according to claim 9, wherein based on the total weight of the dry weight of the bismuth-boron-selenium glass frit, the bismuth-boron- selenium glass frit contains no more than 1.2 wt % of $TeO_2$, or does not contain any form of tellurium.

15. The conductive paste composition according to claim 9, in use of an n-type crystalline silicon solar cell, wherein the conductive paste composition etches and fires through the passivation film of the n-type crystalline silicon solar cell, and a conductive structure electrically contacting a p-type doped emitter of the n-type crystalline silicon solar cell is formed.

16. An n-type crystalline silicon solar cell electrode, comprising:
   a semiconductor substrate having an n-type crystalline silicon substrate, a p-type doped emitter disposed on the surface of the n-type crystalline silicon substrate, and at least one passivation film deposited on the surface of the p-type doped emitter; and
   a conductive structure that fires through at least a portion of the passivation film and forms an electrical contact with the p-type doped emitter, wherein the conductive structure is formed of the conductive paste composition according to claim 9.

17. The n-type crystalline silicon solar cell electrode according to claim 16, wherein the n-type crystalline silicon solar cell electrode is an n-PERT solar cell electrode or an n-TOPCon solar cell electrode.

* * * * *